United States Patent
Fukuzumi et al.

(10) Patent No.: US 6,548,844 B1
(45) Date of Patent: Apr. 15, 2003

(54) CAPACITOR HAVING A STRUCTURE CAPABLE OF RESTRAINING DETERIORATION OF DIELECTRIC FILM, SEMICONDUCTOR DEVICE HAVING THE CAPACITOR AND METHOD OF MANUFACTURING THE SAME

(75) Inventors: Yoshiaki Fukuzumi, Yokohama (JP); Yusuke Kohyama, Yokosuka (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/595,029

(22) Filed: Jun. 16, 2000

(30) Foreign Application Priority Data

Jun. 18, 1999 (JP) ............................................ 11-173018

(51) Int. Cl.⁷ ...................... H01L 27/108; H01L 29/76; H01L 29/94; H01L 31/119
(52) U.S. Cl. ...................... 257/296; 257/303; 257/306
(58) Field of Search ................. 257/295, 296, 257/303, 306, 309; 361/306.2, 306.3; 438/239, 253, 396

(56) References Cited

U.S. PATENT DOCUMENTS 5,005,102 A * 4/1991 Larson ........................ 257/295
5,914,512 A * 6/1999 Huang ......................... 257/306
6,040,596 A * 3/2000 Choi et al. ................... 257/306
6,146,939 A * 11/2000 Dasgupta ..................... 438/251
6,180,974 B1 * 1/2001 Okutoh et al. ............... 257/306

FOREIGN PATENT DOCUMENTS

| JP | 5-101649 | 4/1993 |
| JP | 9-63281 | 3/1997 |

* cited by examiner

Primary Examiner—Olik Chaudhuri
Assistant Examiner—Hoai Pham
(74) Attorney, Agent, or Firm—Oblon, Spivak, McClelland, Maier & Neustadt, P.C.

(57) ABSTRACT

A semiconductor device having a structure capable of restraining deterioration of a dielectric film of a capacitor even when annealing is performed in a hydrogen-containing atmosphere. This semiconductor device includes one electrode or a plurality of dispersion electrodes formed in a dispersed manner above a semiconductor substrate, and a plate electrode commonly facing the one electrode or dispersion electrodes via respective dielectric films. This plate electrode includes a lower conductive layer formed on the dielectric films, a barrier layer formed on the lower conductive layer and an upper conductive layer formed on the barrier layer.

35 Claims, 24 Drawing Sheets

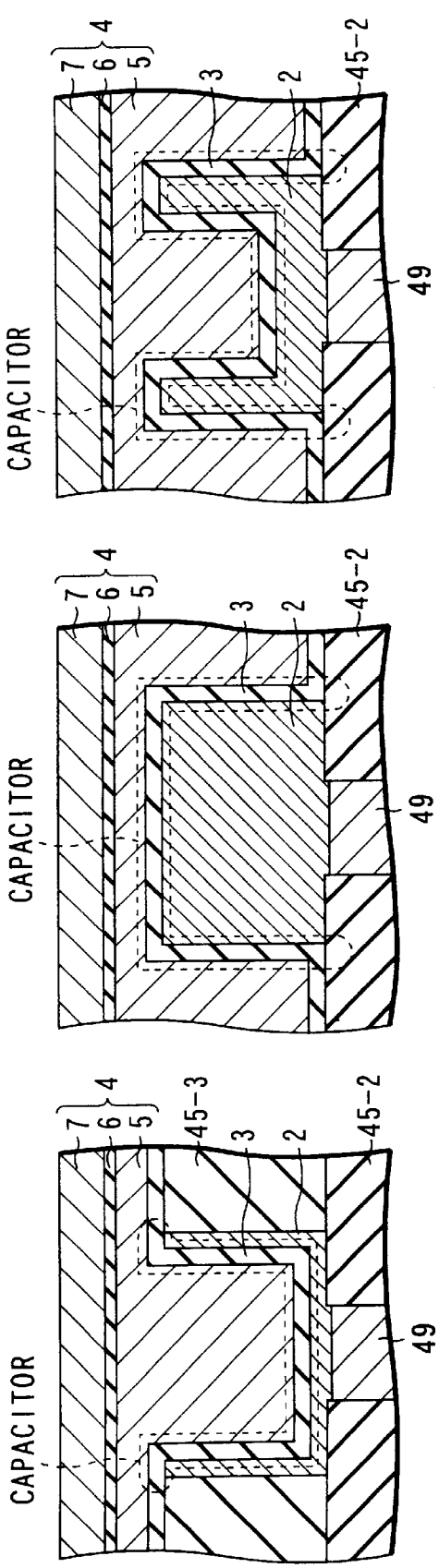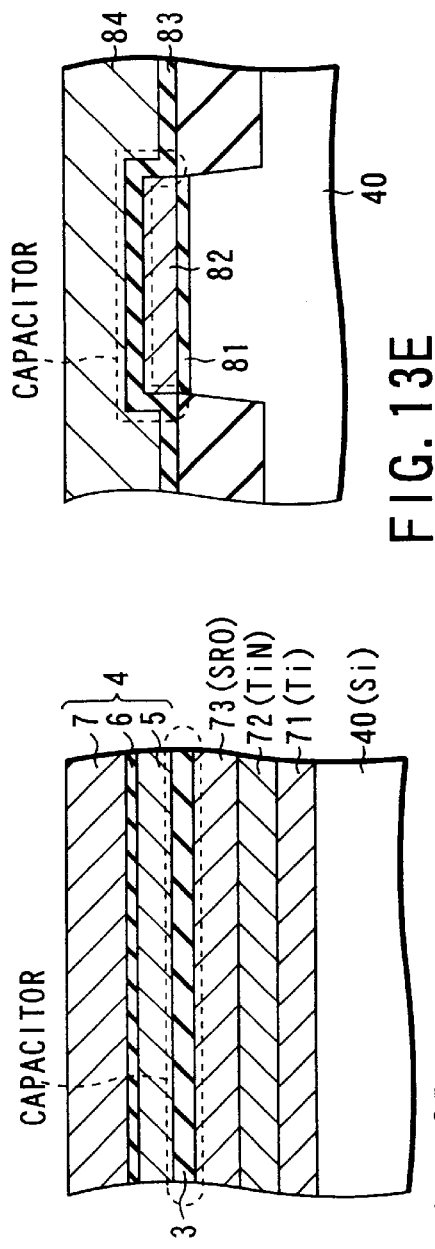

CAPACITOR HAVING A STRUCTURE CAPABLE OF RESTRAINING DETERIORATION OF DIELECTRIC FILM, SEMICONDUCTOR DEVICE HAVING THE CAPACITOR AND METHOD OF MANUFACTURING THE SAME

CROSS-REFERENCE TO RELATED APPLICATIONS

This application is based upon and claims the benefit of priority from the prior Japanese Patent Application No. 11-173018, filed Jun. 18, 1999, the entire contents of which are incorporated herein by reference.

BACKGROUND OF THE INVENTION

The present invention relates to the structure of a capacitor, and, more particularly, to suppression of the deterioration of a capacitor originated from the deterioration of a dielectric film which constitutes a capacitor film.

As the microfabrication of semiconductor devices such as DRAM and FRAM progresses, the cell area becomes smaller, making it difficult to secure the capacitance of capacitors that is demanded for storing data.

As one solution to this problem, in the case of DRAMs, for example, an attempt has been considered which gains a greater capacitance for the same capacitor area by using a high-dielectric substance such as BSTO having a higher dielectric constant than that of a silicon oxide film or silicon nitride film, which has conventionally been used as a capacitor film.

The fabrication of semiconductor devices requires that annealing in a hydrogen-containing atmosphere (hereinafter called "hydrogen annealing") after a multi-layer interconnection step in order to eliminate a plasma damage caused by the multi-layer interconnection step after forming a capacitor, thereby providing excellent transistor characteristics and leak characteristic. This hydrogen annealing is also called "sintering".

It however became apparent that high-dielectric substances such as BSTO, or ferroelectric substances such as PZT have a low resistance to hydrogen annealing so that hydrogen annealing significantly deteriorates their film qualities. One possible cause for this deterioration is that hydrogen works as a reducing agent to reduce BSTO or PZT containing oxygen in hydrogen annealing.

This deterioration of a dielectric film which constitutes a capacitor film is likely to degrade the capacitor characteristics.

BRIEF SUMMARY OF THE INVENTION

Accordingly, it is a primary object of the present invention to provide a capacitor whose structure is capable of restraining the deterioration of a dielectric film even when annealing is performed in a hydrogen-containing atmosphere, and a semiconductor device having this capacitor.

It is another object of the present invention to provide a semiconductor device having a circuit structure which can suppress the deterioration of a data retaining characteristic.

To achieve the first object, according to one aspect of this invention, there is provided a semiconductor device comprising:
one electrode formed above a semiconductor substrate or a plurality of dispersion electrodes formed in a dispersed manner above a semiconductor substrate; and
a plate electrode facing the one electrode of dispersion electrodes via a dielectric film and including a lower conductive layer formed on the dielectric film, a barrier layer formed on the lower conductive layer and an upper conductive layer formed on the barrier layer.

In this semiconductor device, the plate electrode includes the lower conductive layer, the barrier layer and the upper conductive layer. This plate electrode faces the one electrode or dispersion electrodes via the dielectric film and is one constituting element of a capacitor. Various materials can be selected for the barrier layer included in the plate electrode, regardless of the insulating property and the conductivity. For example, using a reducing material or a material which has a fine film quality for the barrier layer can reduce the amount of the reducing agent that reaches the dielectric film. Even if a material whose film quality is deteriorated by reduction is used for the dielectric film, therefore, the degradation of the dielectric film can be restrained. Even when annealing is performed in an atmosphere containing a reducing agent, therefore, it is possible to suppress the degradation of the dielectric film.

To achieve the second object, according to another aspect of this invention, there is provided a semiconductor device comprising:
memory cells each having a cell capacitor which includes a storage electrode and a plate electrode facing the storage electrode via a dielectric film;
a circuit for generating a potential to be applied to the plate electrode; and
a capacitor connected in series between an output terminal of the circuit and the plate electrode.

This semiconductor device has the capacitor connected in series between the output terminal of the circuit, which generates a potential to be applied to the plate electrode, and the plate electrode. This capacitor absorbs noise which is produced by memory cells at the time of data access. This makes it hard for that noise to go outside.

The capacitor also absorbs noise which is produced outside the memory cells. This makes it difficult for that noise to reach the plate electrode, thereby suppressing the deterioration of the data retaining characteristic that is originated from the noise applied to the plate electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7A, 7B, 7C, 7D, 7E, 7F, 7G, 7H and 7I are cross-sectional views illustrating a DRAM according to the second embodiment of this invention step by step of main fabrication steps;

FIG. 13A is a cross-sectional view of a concave stacked capacitor;

FIG. 13B is a cross-sectional view of a convex stacked capacitor;

FIG. 13C is a cross-sectional view of a cylindrical stacked capacitor;

FIG. 13D is a cross-sectional view of a planar capacitor;

FIG. 13E is a cross-sectional view of a stacked gate transistor; and

DETAILED DESCRIPTION OF THE INVENTION

Figure 1:
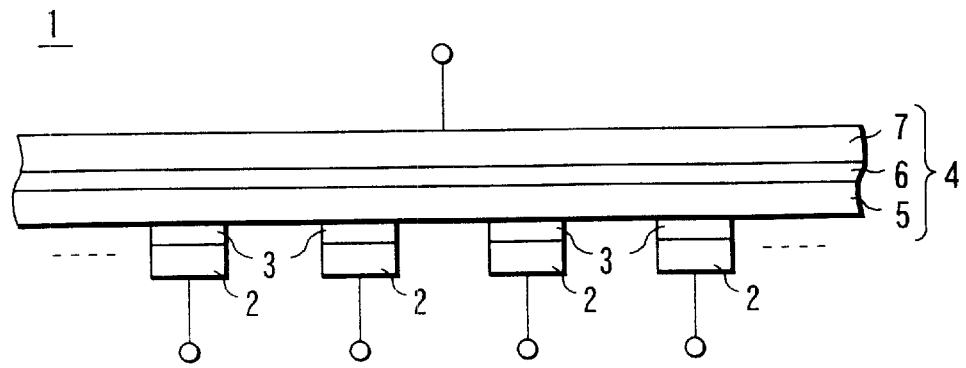
FIG. 1 is a diagram showing a capacitor structure according to a first embodiment of this invention.

Preferred embodiments of the present invention will now be described with reference to the accompanying drawings. In the following description, like or same reference numerals are given to corresponding components in the drawings.

(First Embodiment)

FIG. 1 is a diagram showing a capacitor structure according to the first embodiment of this invention.

As shown in FIG. 1, the capacitor structure 1 according to the first embodiment of this invention has a plurality of dispersion electrodes 2 dispersed, and a common electrode 4 common to those dispersion electrodes 2. The common electrode 4 faces the dispersion electrodes 2 via respective capacitor films (dielectric films) 3. The common electrode 4 has a lamination structure comprised of at least three layers, namely a lower conductive layer 5, a barrier layer 6 and an upper conductive layer 7. The lower conductive layer 5 faces the dispersion electrodes 2 via the respective capacitor films 3. The upper conductive layer 7 faces the lower conductive layer 5 via the barrier layer 6.

Figure 2:
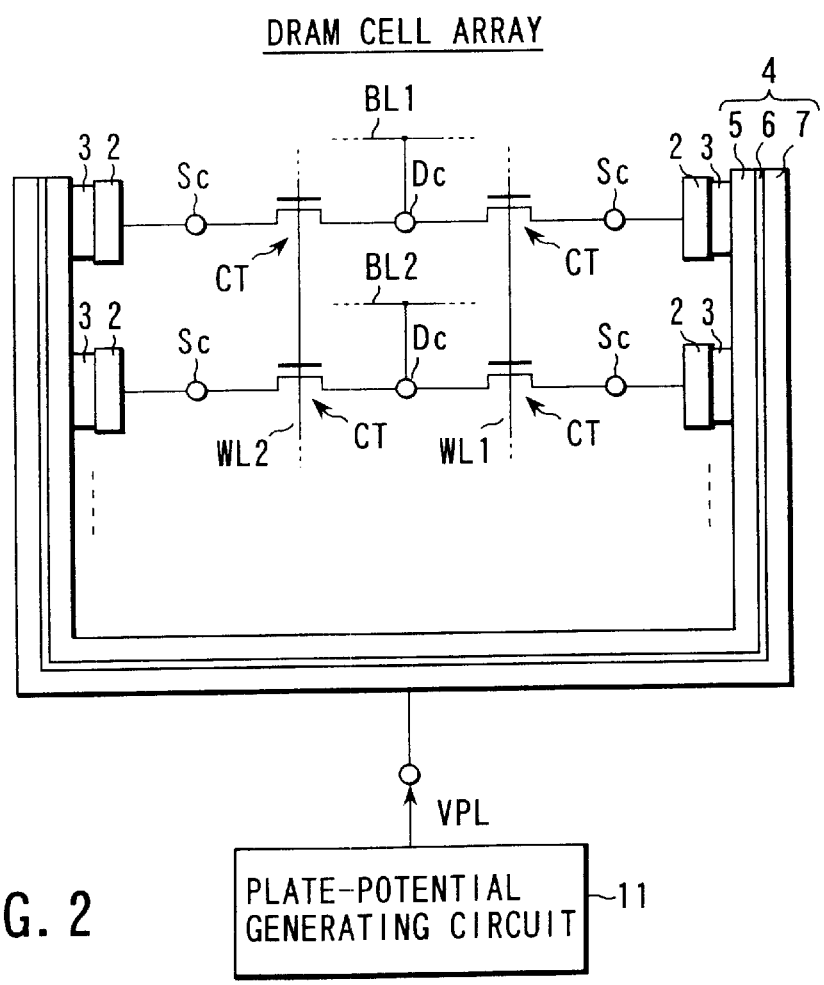
FIG. 2 is a diagram depicting a DRAM cell array according to the first embodiment of this invention.

FIG. 2 is a diagram depicting a 1-transistor-1-capacitor type DRAM cell array which has the capacitor structure 1 according to the first embodiment.

As shown in FIG. 2, the DRAM cell array has an array of cell transistors CT. The cell transistors CT have gates which serve as word lines WL (WL1, WL2), drains Dc connected to bit lines BL (BL1, BL2), and sources Sc connected to the respective dispersion electrodes 2. The dispersion electrodes 2 face the common electrode 4 via the respective capacitor films 3. A plate potential VPL is generated from a plate potential generating circuit 11 and supplied to the common electrode 4. As a result, the common electrode 4 functions as a plate electrode, and the dispersion electrodes 2 as storage electrodes.

Figure 3A:
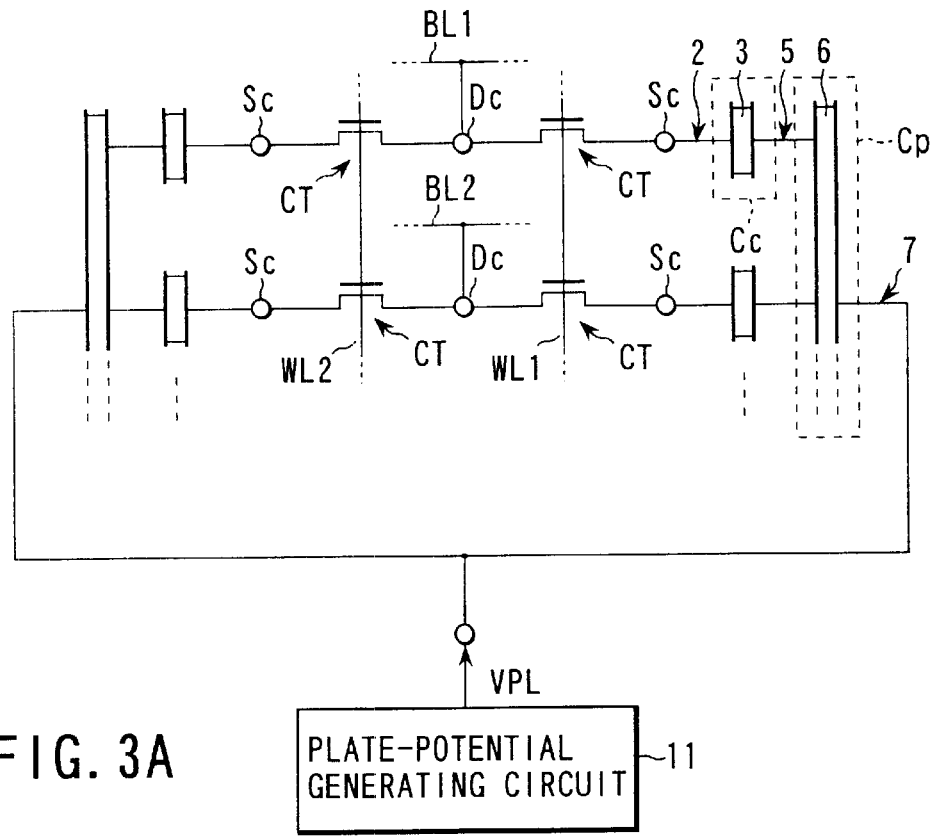
FIG. 3A is an equivalent circuit diagram of a DRAM cell array when a barrier layer has an insulating property.
Figure 3B:
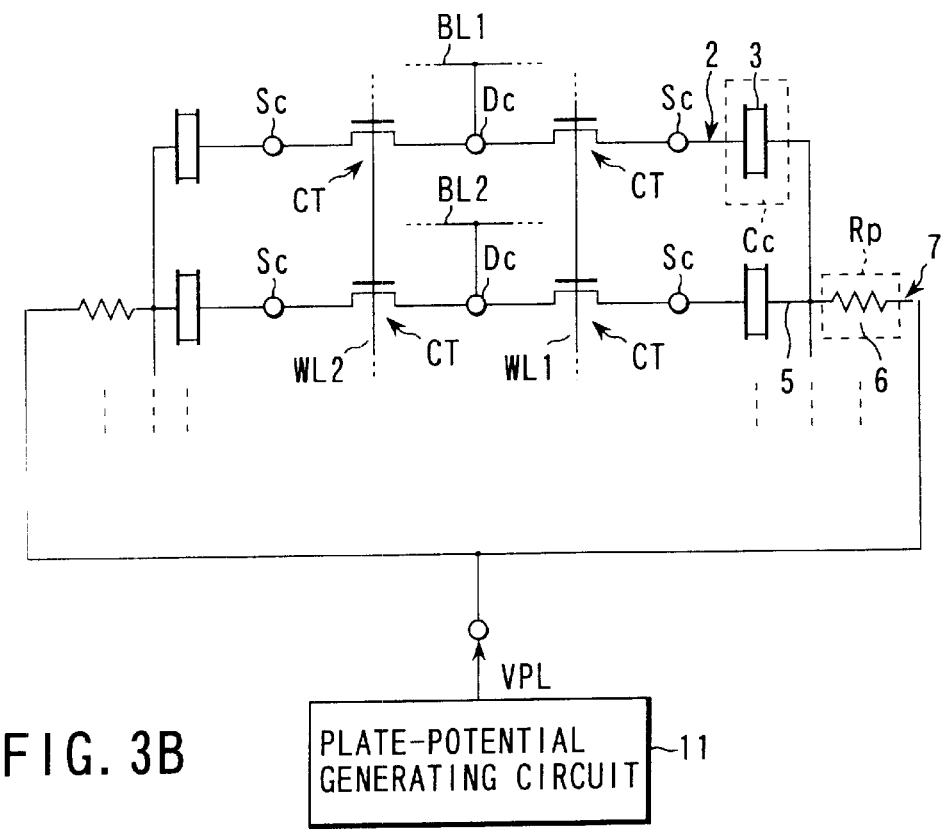
FIG. 3B is an equivalent circuit diagram of a DRAM cell array when the barrier layer has a conductivity.

FIG. 3A is a diagram showing an equivalent circuit of a DRAM cell array when the barrier layer 6 has an insulating property, and FIG. 3B is a diagram showing an equivalent circuit of a DRAM cell array when the barrier layer 6 has a conductivity.

As shown in FIG. 3A, when the barrier layer 6 has an insulating property, the source Sc of each cell transistor CT is connected to the plate potential generating circuit 11 via two capacitors Cc and Cp that are connected in series to each other. The plate potential VPL is supplied from the upper conductive layer 7 of the capacitor Cp to the lower conductive layer 5 common to the capacitors Cc and Cp by, for example, capacitive coupling. Accordingly, the capacitor Cc which is comprised of the dispersion electrode 2, the capacitor film 3 and the lower conductive layer 5 serves as a cell capacitor and charges according to data are stored in the capacitor film 3.

As shown in FIG. 3B, when the barrier layer 6 has a conductivity, the source Sc of each cell transistor CT is connected to the plate potential generating circuit 11 via a resistor Rp and a capacitor Cc that are connected in series to each other. The plate potential VPL is supplied from the upper conductive layer 7 to the lower conductive layer 5 of the capacitor Cc via the resistor Rp comprised of the barrier layer 6. Accordingly, as in the previous case where the barrier layer 6 has an insulating property, the capacitor which is comprised of the dispersion electrode 2, the capacitor film 3 and the lower conductive layer 5 serves as a cell capacitor and charges according to data are stored in the capacitor film 3.

Figure 4:
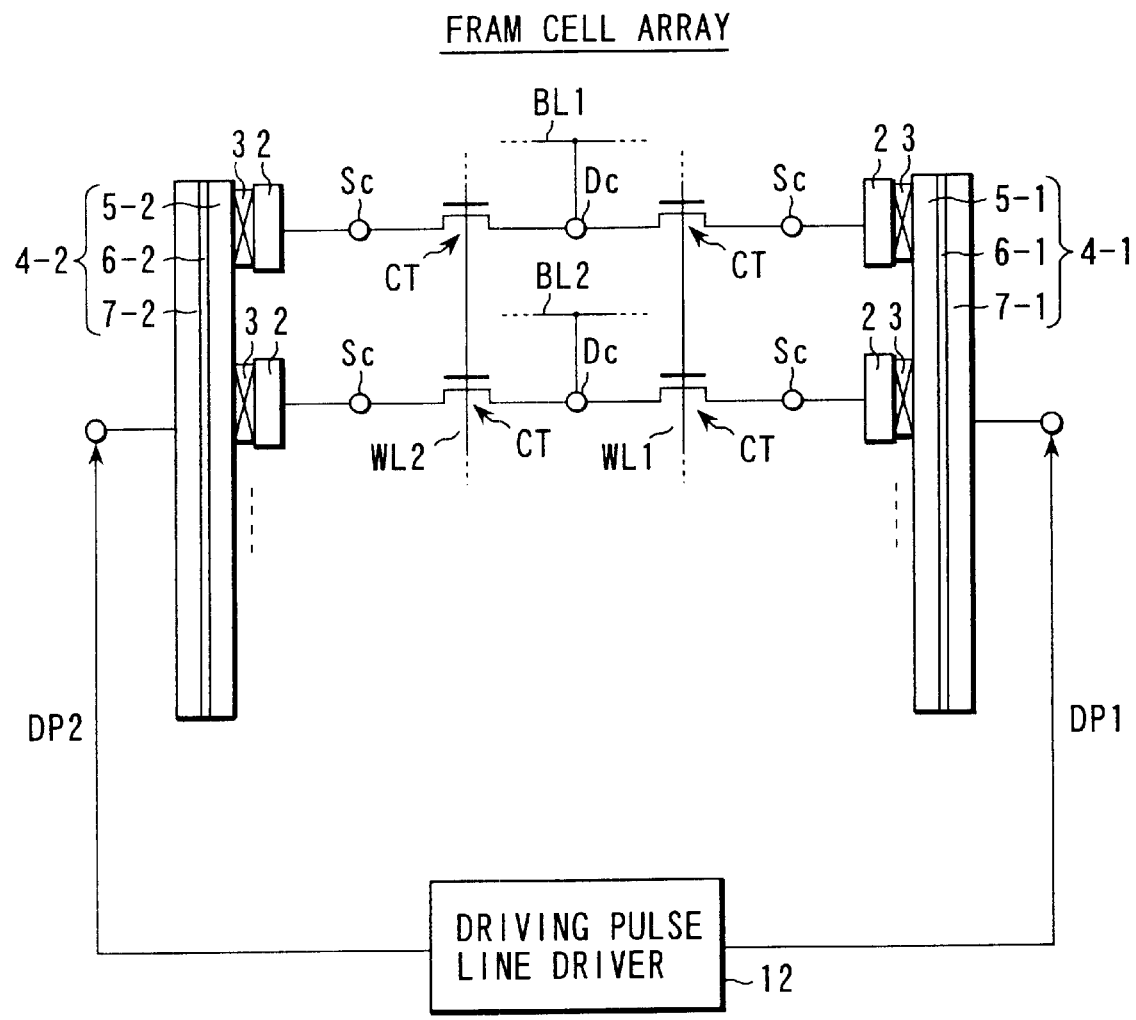
FIG. 4 is a diagram illustrating an FRAM cell array which uses the capacitor structure according to the first embodiment of this invention.

FIG. 4 is a diagram illustrating a 1-transistor-1-capacitor type FRAM cell array which uses the capacitor structure 1 according to the first embodiment.

As shown in FIG. 4, the FRAM cell array has an array of cell transistors CT. The cell transistors CT have gates which serve as word lines WL (WL1, WL2), sources connected to bit lines BL (BL1, BL2), and drains connected to the respective dispersion electrodes 2.

In the case where the FRAM uses a driving pulse in reading and writing data, the common electrode is separated into common electrodes 4-1 and 4-2 for the respective word lines WL, for example. The dispersion electrodes 2 face the common electrodes 4-1 and 4-2 via the capacitor films 3. A driving pulse DP1 is supplied to the upper conductive layer, 7-1, of the common electrode 4-1 from a driving pulse line driver (the driving pulse line is also called "plate line") 12, and a driving pulse DP2 is supplied to the upper conductive layer, 7-2, of the common electrode 4-2 from the driving pulse line driver 12.

Figure 5A:
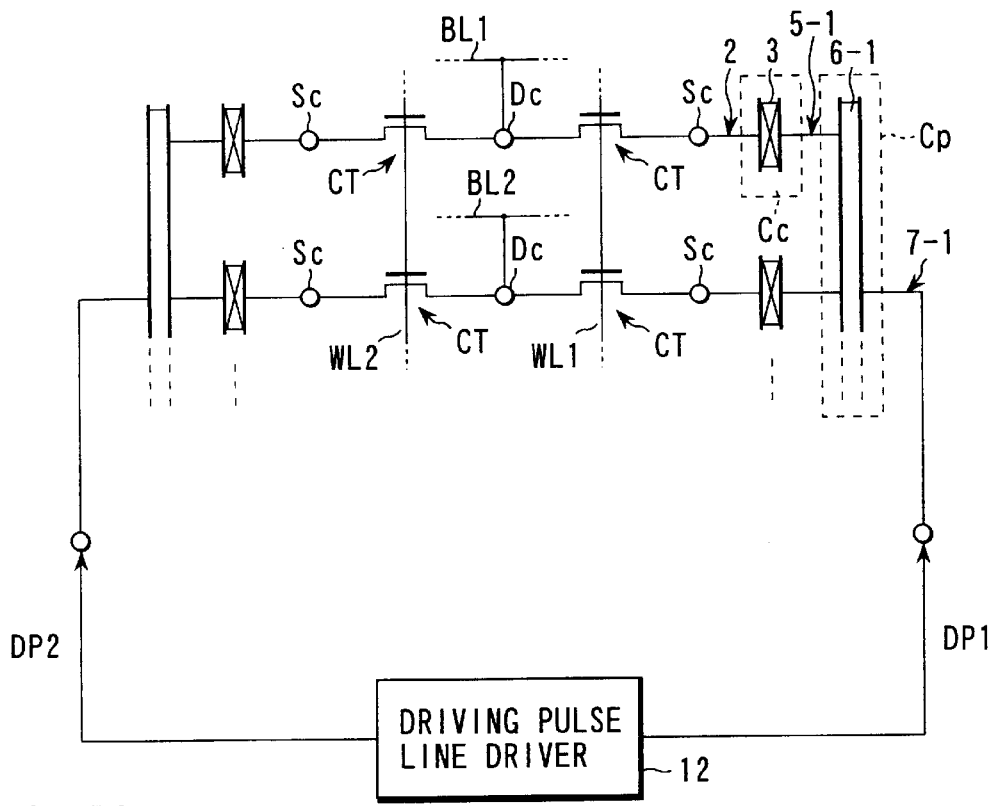
FIG. 5A is an equivalent circuit diagram of an FRAM cell array when a barrier layer has an insulating property.
Figure 5B:
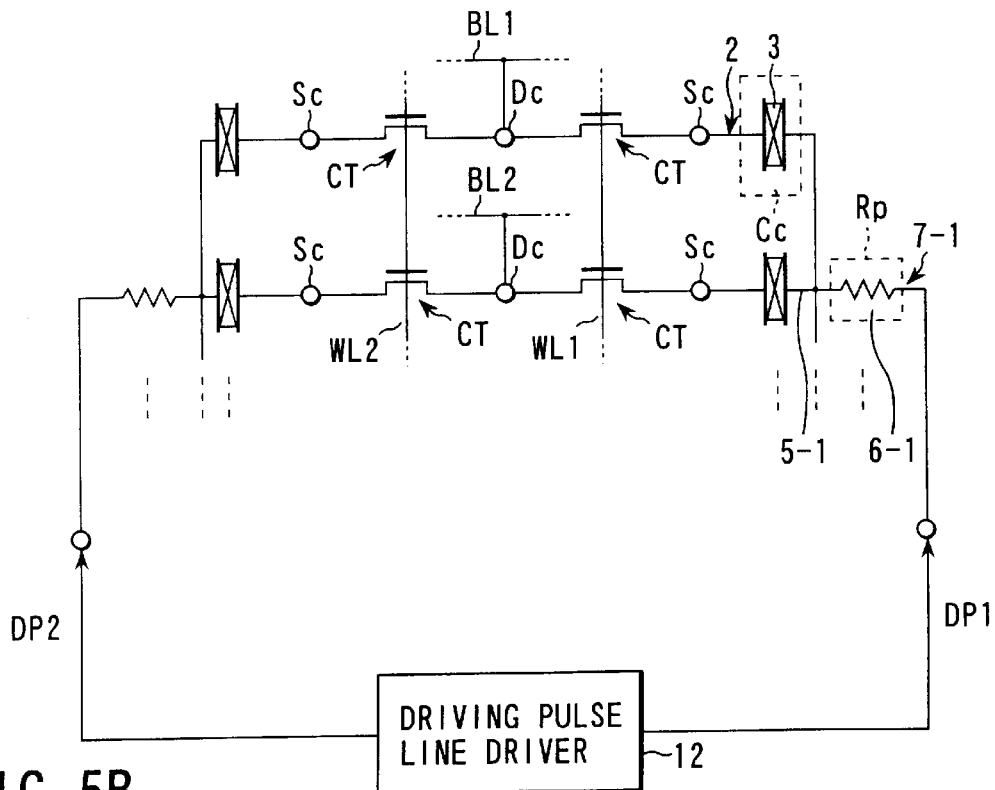
FIG. 5B is an equivalent circuit diagram of an FRAM cell array when the barrier layer has a conductivity.

FIG. 5A is a diagram showing an equivalent circuit of an FRAM cell array when the barrier layer 6 has an insulating property, and FIG. 5B is a diagram showing an equivalent circuit of an FRAM cell array when the barrier layer 6 has a conductivity.

As shown in FIG. 5A, when the barrier layer 6 has an insulating property, the source Sc of each cell transistor CT is connected to the driving pulse line driver 12 via two capacitors Cc and Cp that are connected in series to each other. The driving pulse DP1 is supplied from the upper conductive layer 7-1 of the capacitor Cp to the lower conductive layer 5 common to the capacitors Cc and Cp by, for example, capacitive coupling. Accordingly, the capacitor Cc which is comprised of the dispersion electrode 2, the capacitor film 3 and the lower conductive layer 5 serves as a cell capacitor and the capacitor film 3 is polarized according to data.

As shown in FIG. 5B, when the barrier layer 6 has a conductivity, the source Sc of each cell transistor CT is connected to the driving pulse line driver 12 via a resistor Rp and a capacitor Cc that are connected in series to each other. The driving pulse DP1 is supplied from the upper conductive layer 7 to the lower conductive layer 5 of the capacitor Cc via the resistor Rp comprised of the barrier layer 6. Accordingly, as in the previous case where the barrier layer 6 has an insulating property, the capacitor which is comprised of the dispersion electrode 2, the capacitor film 3 and the lower conductive layer 5 serves as a cell capacitor and the capacitor film 3 is polarized according to data.

As apparent from the above, the capacitor film 3 having the capacitor structure 1 can be used as a dielectric substance of a cell capacitor or a dielectric substance for retaining data in a DRAM or FRAM. In this respect, a high-dielectric substance and ferroelectric substance are preferably7 used for the capacitor film 3. According to this invention, particularly preferable high-dielectric substances and ferroelectric substances include $(Ba,Sr)TiO_3$ (generally, BSTO), $BaTiO_3$, $SrTiO_3$, $Ta_2O_5$, $Pb(Zr,Ti)O_3$ (generally, PZT), $Pb(Nb,Ti)O_3$, $PbZrO_3$, $LiNbO_3$, $SrBi_2Ta_2O_9$, $SrBi_2(Ta,Nb)_2O_9$ and $Bi_4Ti_3O_{13}$.

Those preferable materials are oxides all of which have a low resistance to hydrogen annealing.

According to this invention, therefore, a reducing material or a material which hardly passes hydrogen is used for the barrier layer 6. The following is a list of materials having such a property:

An example of a preferable reducing material is a metal oxide which contains at least one of metals Al, W, Cu, Ti, Co, Ta, Nb, Ru and Ir.

One example of a preferable material which hardly passes hydrogen is a silicon nitride.

The following may be the reasons why the film that contains one of the aforementioned materials suppresses a damage caused by hydrogen annealing.

(1) In the case of metal oxide

At the time hydrogen annealing is performed, not only the capacitor film 3 but also its metal oxide is reduced. Consequently, the amount of hydrogen that reaches the capacitor film 3 decreases, thus suppressing a reduction-originated damage of the capacitor film 3. Excessive oxygen, if contained in the metal oxide, combines with hydrogen. The amount of the hydrogen reaching the capacitor film 3 decreases further. This suppresses the reducing damage to the capacitor film 3.

(2) In the case of silicon nitride

As the film is minute, it hardly passes hydrogen. As in the case of a metal oxide, therefore, the amount of hydrogen that reaches the capacitor film 3 decreases, thus suppressing a reduction-originated damage of the capacitor film 3.

According to the capacitor structure 1 of the first embodiment, the common electrode 4 has a lamination structure comprised of at least three layers which are the lower conductive layer 5, the barrier layer 6 and the upper conductive layer 7. Using a reducing material or a material which hardly passes hydrogen for the barrier layer 6 in the three-layer structure can suppress the deterioration of the film quality of the capacitor film 3 even when hydrogen annealing is carried out.

An example of a preferable material for the lower conductive layer 5 is a conductive material which contains at least one of metals Pt, Ru, Re, Os, Rh, Ir, Fe, Mn, Cr, Co, Ni and Ti, or a metal oxide which contains at least one of those metals, or an alloy of at least one of those metals and at least one of alkaline earth metals, or an oxide of an alloy of at least one of those metals and at least one of alkaline earth metals, or an alloy of at least one of those metals and at least one of rare earth metals, or an oxide of an alloy of at least one of those metals and at least one of rare earth metals.

An example of a preferable material for the upper conductive layer 7 is a conductive material which contains at least one of metals Al, W, Cu, Ti, Co, Ta and Nb, or a compound which contains at least one of those metals, or an alloy which contains at least one of those metals, or a compound of an alloy which contains at least one of those metals.

When the lower conductive layer 5, the barrier layer 6 and the upper conductive layer 7 constitute the capacitor Cp, it is desirable that the capacitance of the capacitor Cp be larger than that of the capacitor Cc which is comprised of the lower conductive layer 5, the capacitor film 3 and the dispersion electrode 2.

When the capacitance of the capacitor Cp is smaller than that of the capacitor Cc, for example, the lower conductive layer 5 may be coupled to the dispersion electrode 2 so that the potential of the lower conductive layer 5 varies in accordance with a change in the potential of the dispersion electrode 2. This makes it difficult to charge or polarize the capacitor film 3.

Such a situation can be improved by making the capacitance of the capacitor Cp greater than that of the capacitor Cc.

Further, it is desirable that the electrical resistivity of the upper conductive layer 7 be lower than that of the lower conductive layer 5 and that of the barrier layer 6. Making the electrical resistivity of the upper conductive layer 7 lower than that of the lower conductive layer 5 and that of the barrier layer 6 reduces the resistance of the common electrode 4 itself. The reduced resistance of the common electrode 4 can permit the potential of the common electrode 4 to be effectively applied to the entire dispersion electrode 2.

Some of specific examples wherein the capacitor structure 1 according to this invention is adapted to a semiconductor memory, particularly, to a stacked DRAM, will be discussed as other embodiments one by one.

Second Embodiment

Figure 6A:
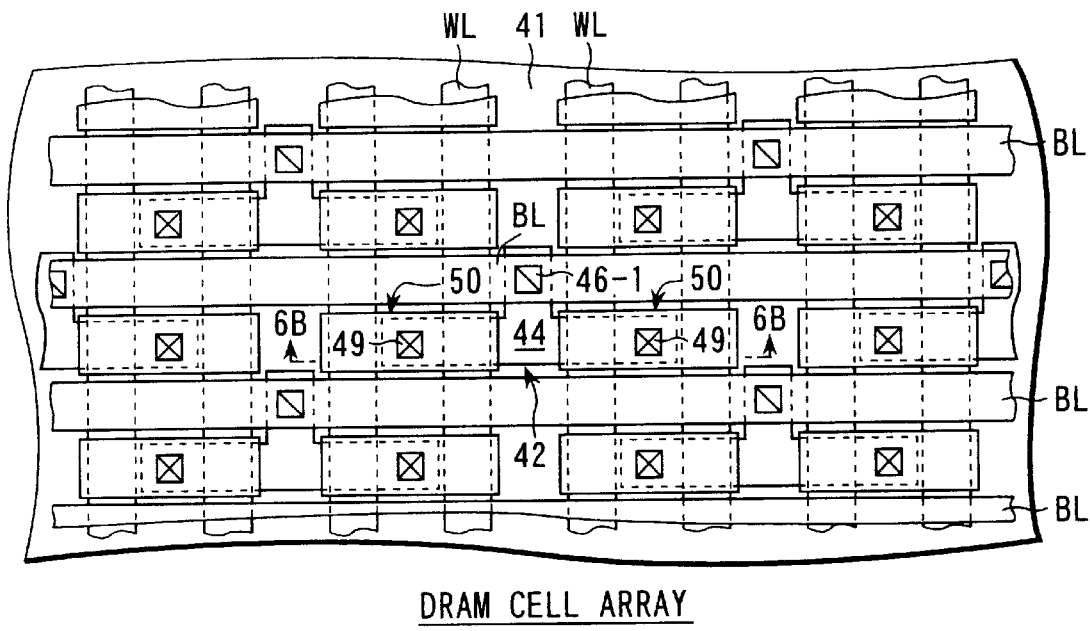
FIG. 6A is a plan view of a DRAM cell array according to a second embodiment of this invention.
Figure 6B:
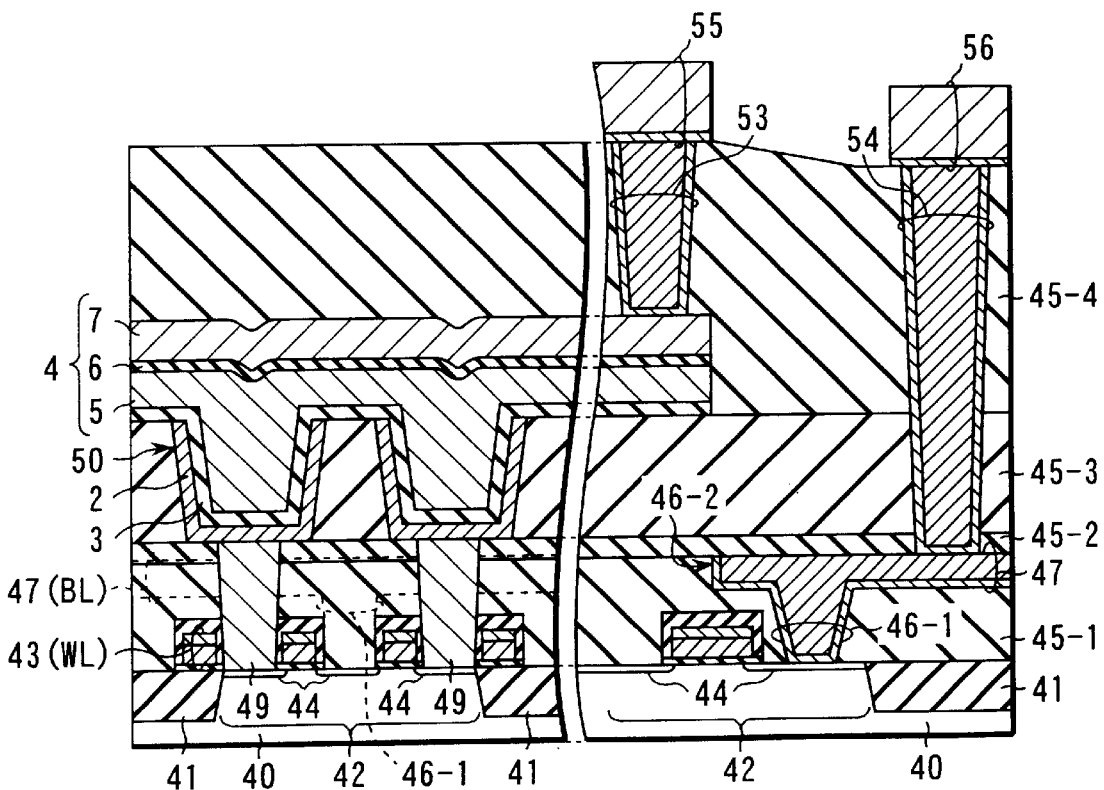
FIG. 6B is a cross-sectional view taken along the line 6B—6B in FIG. 6A.

FIG. 6A is a plan view of a DRAM cell array according to the second embodiment of this invention, and FIG. 6B is a cross-sectional view showing the cross sections of the DRAM cell array according to the second embodiment and a peripheral circuit of the DRAM. The cross section of the DRAM cell array in FIG. 6B is taken along the line 6B—6B in FIG. 6A and shows a portion where the storage electrode appears. The cross section of the DRAM peripheral circuit in FIG. 6B shows a portion where the plate electrode in the peripheral circuit appears.

The DRAM shown in FIGS. 6A and 6B together with its manufacturing method will be discussed below.

FIGS. 7A through 7I are cross-sectional views illustrating the DRAM according to the second embodiment of this invention step by step of main fabrication steps.

Figure 7A:
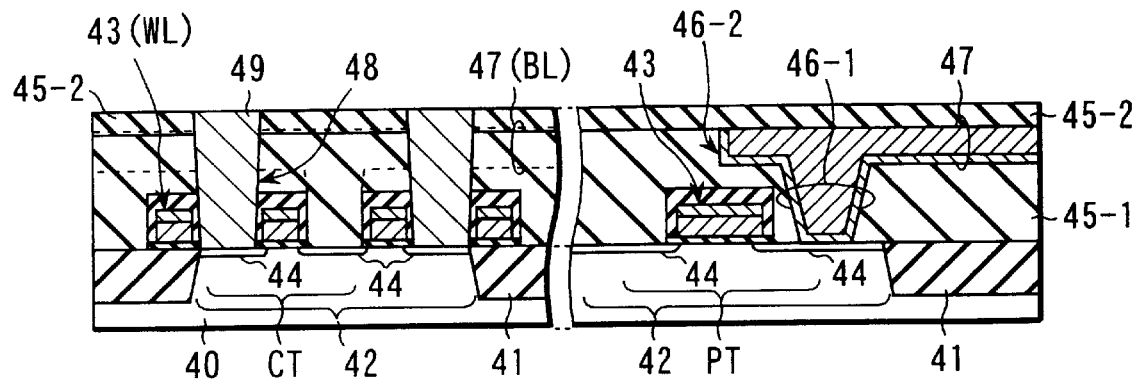

First, the structure that is shown in FIG. 7A is constructed by using a known method. The following exemplifies how to form that structure. As shown in FIG. 7A, device isolation regions 41 are formed in a silicon substrate 40 and device regions 42 where active elements are to be formed are defined on the silicon substrate 40. Next, gate electrodes 43 are formed on the silicon substrate 40 and then source/drain regions 44 are formed in the respective device regions 42. As a result, cell transistors CT are formed in the cell array portion shown in FIGS. 6A and 6B, and peripheral transistors PT are formed in the peripheral circuit portion. The gate electrodes 43 of the cell transistors CT are word lines WL. Each gate electrode 43 is formed of a lamination film comprised of conductive polysilicon and a high-melting point metal silicide. Next, a first interlayer insulating film 45-1 is formed and contact holes 46-1 which are connected to the associated source or drain regions 44 and interconnection holes 46-2 are formed in the first interlayer insulating film 45-1. Then, interconnection layers 47 are formed in the holes 46-1 and 46-2. The interconnection layers 47 are formed by a lamination film comprising, for example, titanium nitride (TiN) and titanium (Ti). The interconnection layer 47 shown on the left-hand side in FIG. 6B indicates that of the lines for the peripheral circuit for which the same layer as the bit lines BL is used. Then, a second interlayer insulating film 45-2 is formed. Then, contact holes 48 which are connected to the other ones of the source/drain regions 44 are formed in the first interlayer insulating film 45-1 and the second interlayer insulating film 45-2. Next, a contract plug 49 is formed in each contact hole 48.

Figure 7B:
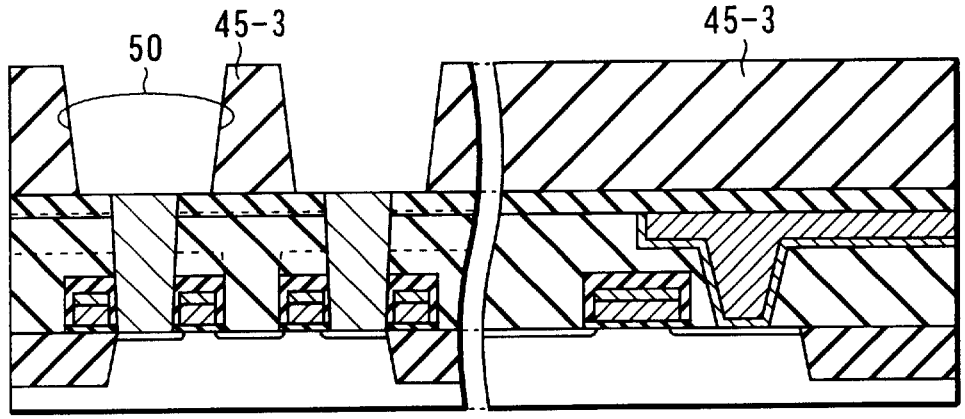

As shown in FIG. 7B, a third interlayer insulating film 45-3 is formed on the second interlayer insulating film 45-2 where the contact plugs 49 are exposed. Then, openings 50 for forming cell capacitors are formed in the third interlayer insulating film 45-3 by using photolithography and RIE.

Figure 7C:
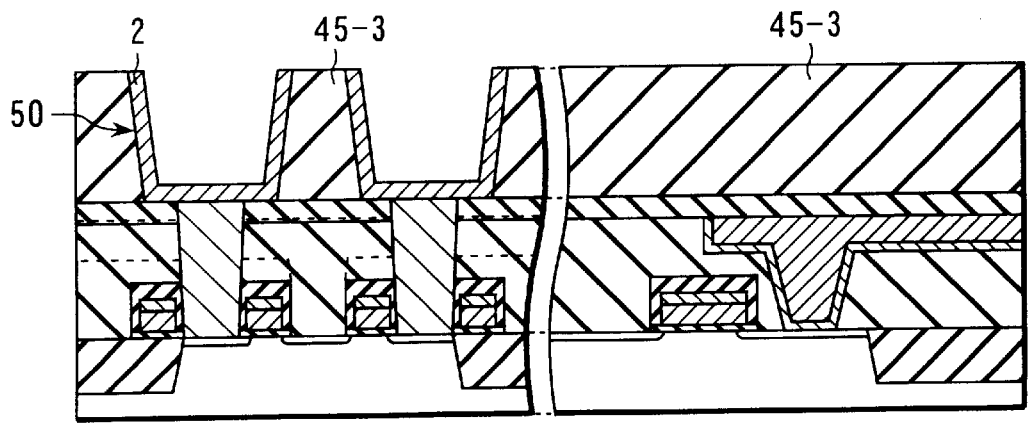

Next, as shown in FIG. 7C, a conductor such as SrRuO$_3$ (hereinafter referred to as "SRO") is deposited on the third interlayer insulating film 45-3 where the openings 50 are formed, thereby forming an SRO film. Then, those portions of the SRO film which exclude what is located in the openings 50 are removed by using CMP, for example. As a result, storage electrodes 2 of the SRO film are formed in the openings 50. The storage electrodes 2 are connected to the other ones of the source/drain regions 44 via the respective contact plugs 49.

Figure 7D:
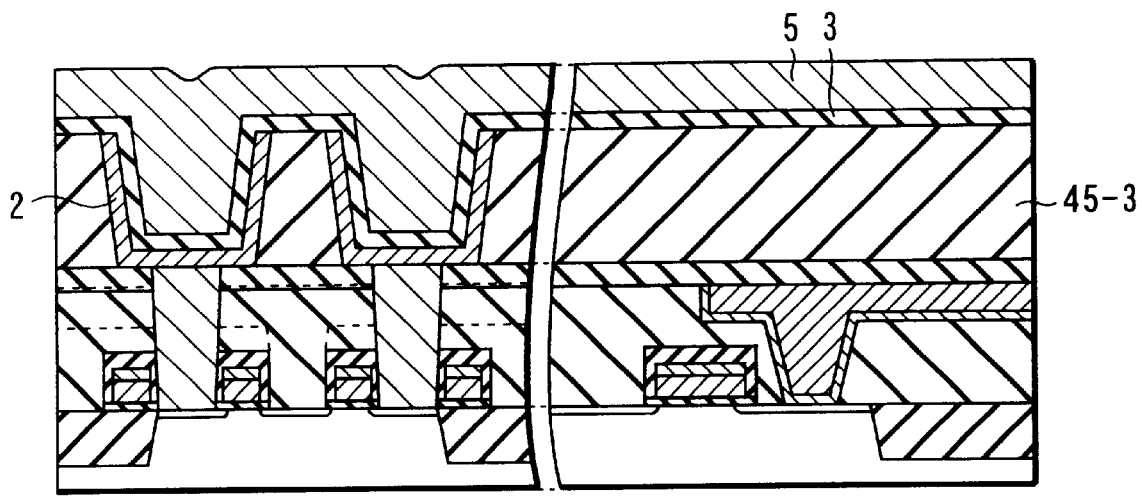

Next, a high-dielectric substance such as BSTO or a ferroelectric substance is deposited on the storage electrodes 2 and the third interlayer insulating film 45-3, thus forming the capacitor film 3 as shown in FIG. 7D. If the capacitor film 3 is made of BSTO, it is desired that the film 3 be about 20 nm thick. If the film 3 is made of Ta$_2$O$_5$, it is desirable that the film 3 be about 10 nm to 15 nm thick. Then, a conductor such as SRO is deposited on the capacitor film 3, thereby forming the lower conductive layer 5.

Figure 7E:
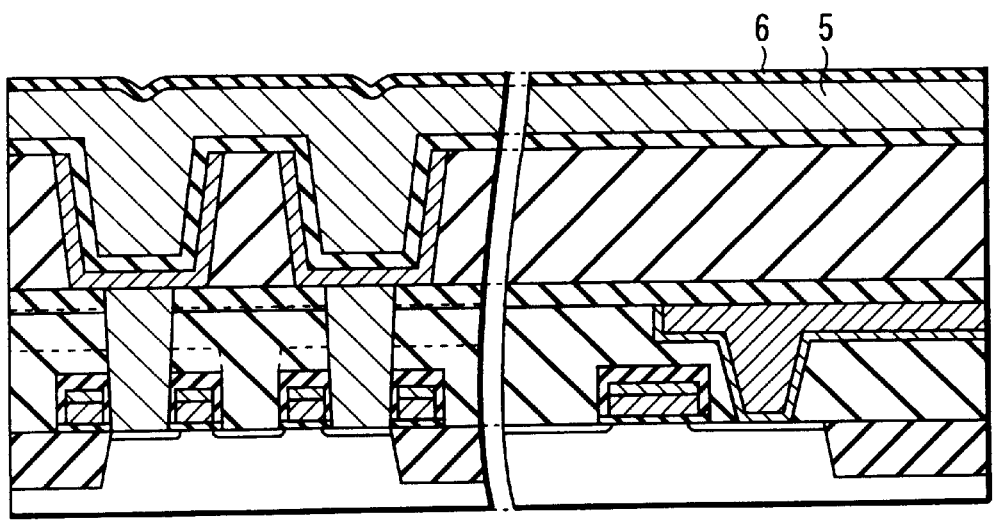

Next, alumina (Al$_2$O$_3$) or the like is deposited on the lower conductive layer 5 to thereby form the barrier layer 6 as shown in FIG. 7E. When the barrier layer 6 has an insulating property, it is desirable that its thickness be about 1 nm to 50 nm. When the barrier layer 6 is of alumina, particularly, the thickness should desirably be about 5 nm. To form an alumina film as thin as about 5 nm, aluminum should be sputtered in an atmosphere containing, for example, oxygen.

Figure 7F:
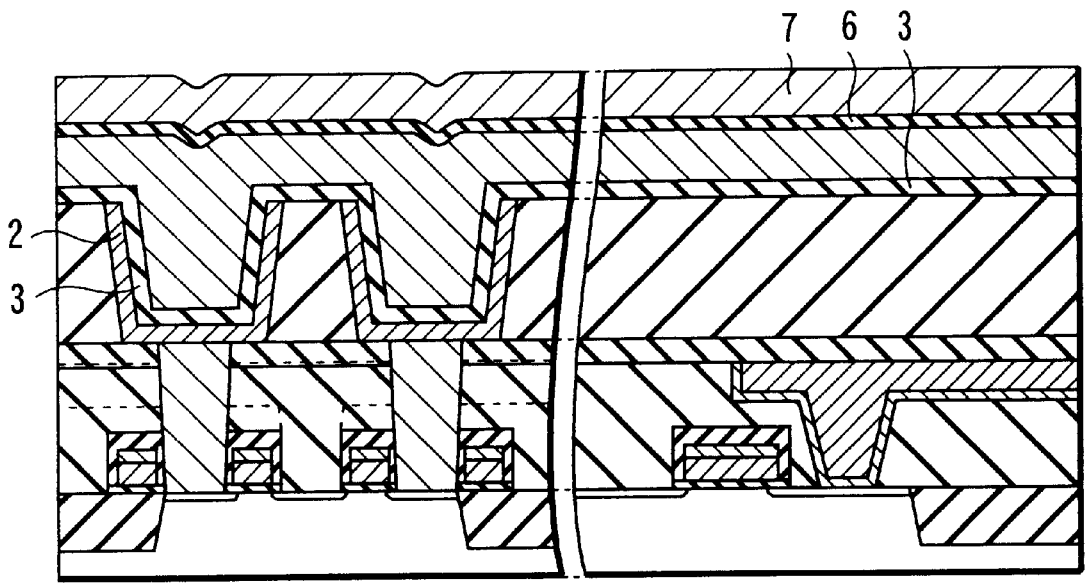

Then, a conductor such as aluminum is deposited on the barrier layer 6 by sputtering, thus forming the upper conductive layer 7, as shown in FIG. 7F.

Figure 7G:
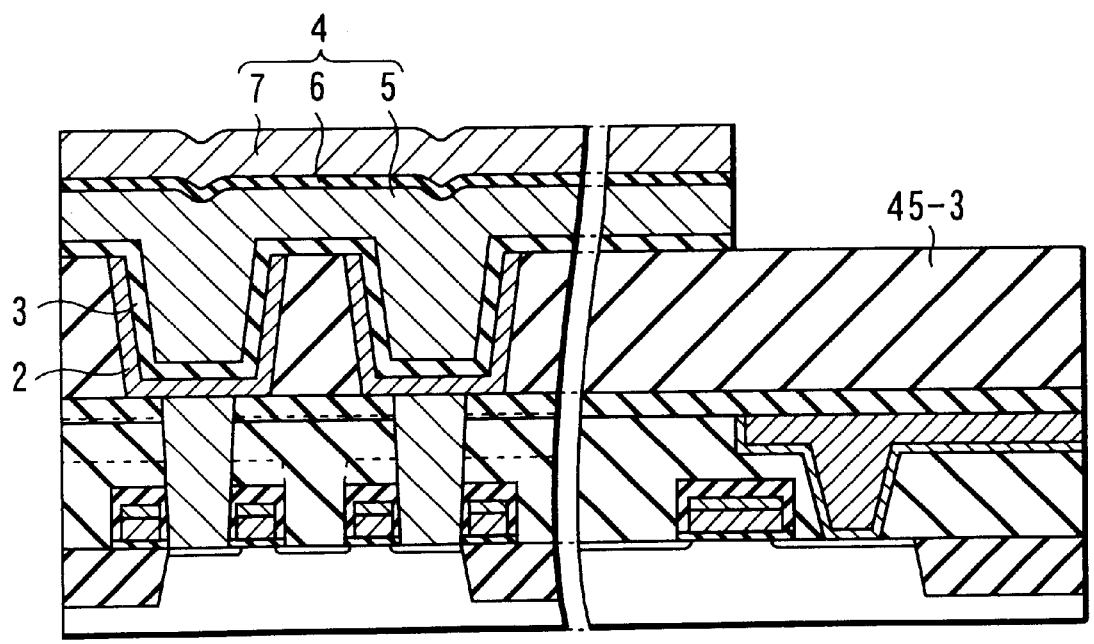

Next, the upper conductive layer 7, the barrier layer 6 and the lower conductive layer 5 are etched at a time by using photolithography and RIE, thus forming the plate electrode 4 as shown in FIG. 7G. Accordingly, the plate electrode 4 formed has a three-layer structure of the lower conductive layer 5, the barrier layer 6 and the upper conductive layer 7.

Figure 7H:
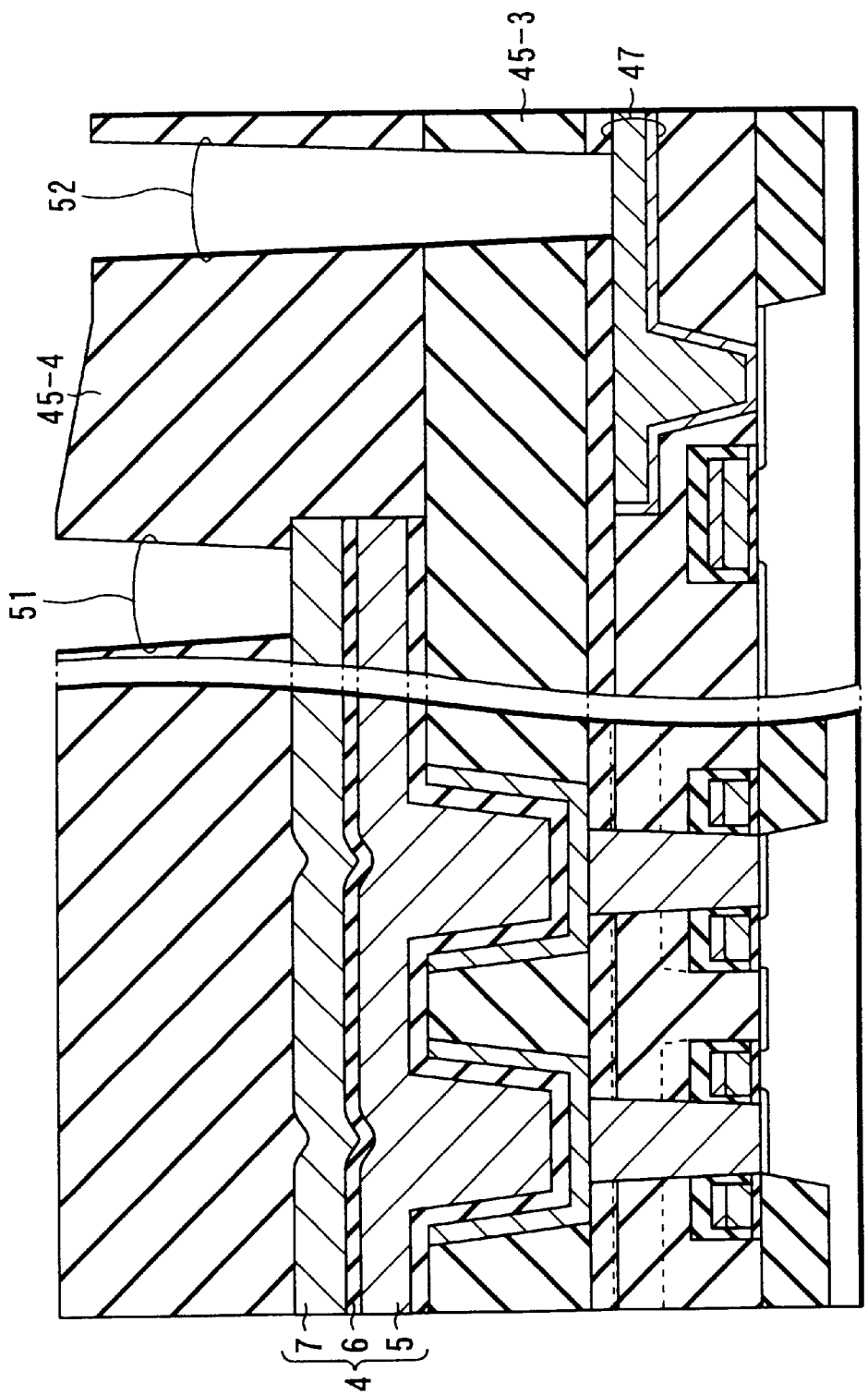
Figure 71:
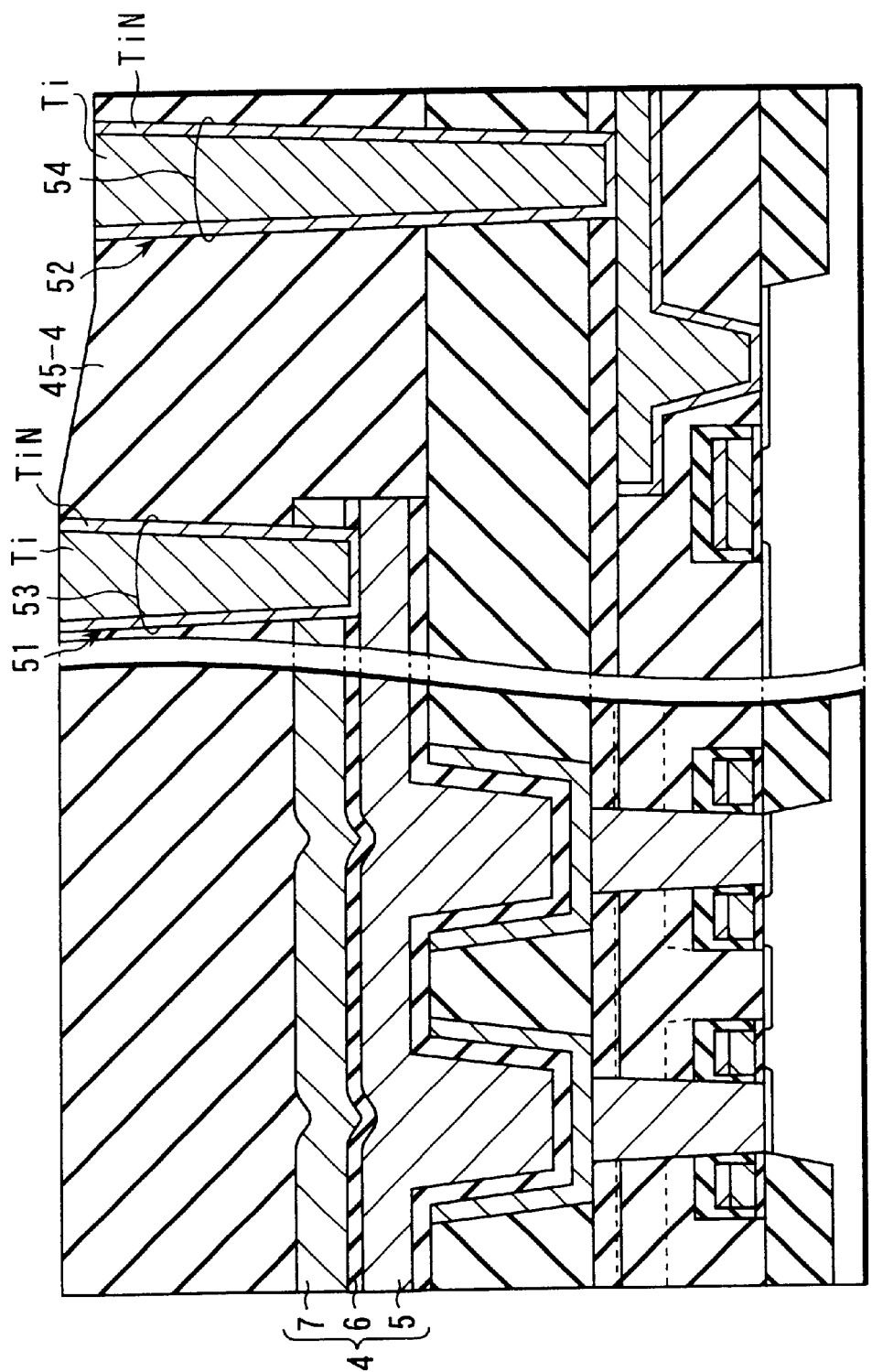

Then, a fourth interlayer insulating film 45-4 is formed on the third interlayer insulating film 45-3 on which the plate electrode 4 is formed, as shown in FIG. 7H. Next, contact holes 51 which are connected to the upper conductive layer 7 and contact holes 52 which are connected to the interconnection layer 47 are formed in the fourth interlayer insulating film 45-4 by using photolithography and RIE.

Next, as shown in FIG. 7I, titanium nitride (TiN) and titanium (Ti) are sequentially deposited on the fourth interlayer insulating film 45-4 where the contact holes 51 and 52 are formed, thus forming a TiN/Ti lamination film. Then, those portions of this lamination film which exclude the contact holes 51 and 52 are removed. As a result, contact plugs 53 and 54 of the TiN/Ti lamination film are respectively formed in the contact holes 51 and 52.

Then, as shown in FIG. 6B, titanium nitride (TiN) and titanium (Ti) are sequentially deposited on the fourth interlayer insulating film 45-4 where the contact plugs 53 and 54 are formed, thus forming a TiN/Ti lamination film. Then, this lamination film is removed by using photolithography and RIE, thus forming interconnection layers 55 and 56.

Thereafter, though not illustrated particularly, further multiple interconnection layers are formed and a passivation film of silicon nitride or silicon dioxide is formed finally. Then, hydrogen annealing is performed to adjust the characteristics of the cell transistors CT and the characteristics of the peripheral transistors PT, which completes the DRAM according to the second embodiment.

According to the DRAM of the second embodiment, the plate electrode 4 has a three-layer structure of the lower conductive layer 5 (SRO), the barrier layer 6 (Al$_2$O$_3$) and the upper conductive layer 7 (Al). Even if hydrogen annealing is carried out after a multi-layer interconnection step, the barrier layer 6 (Al$_2$O$_3$) protects the capacitor film 3 (BSTO) against a reduction-originated damage. It is therefore possible to suppress the degradation of the film quality of the capacitor film 3 and prevent the degradation of the capacitor characteristics, such as an increase in leak current.

According to the second embodiment, sputtering is used as a deposition method for the barrier layer 6.

For the generation of, for example, the 0.15-$\mu$m rule, the minimum width of the openings 50 where capacitors are formed is approximately 0.15 $\mu$m. Depositing the storage electrode 2, the capacitor film 3 and the lower conductive layer 5 in such an opening 50 by, for example, about 0.02 $\mu$m, 0.02 $\mu$m and 0.04 $\mu$m respectively, mostly buries the opening 50. Particularly, the top surface of the lower conductive layer 5 becomes almost planarized.

If the total film thickness of the storage electrode 2, the capacitor film 3 and the lower conductive layer 5 is set equal to or greater than twice the minimum width of the opening 50, the top surface of the lower conductive layer 5 can be planarized. The planarization of the top surface of the lower conductive layer 5 eliminates the need for using such a method, which is excellent in a step coverage property, in forming the barrier layer 6. It is therefore possible to provide a structure to which, for example, sputtering can be used suitably.

Of course, instead of sputtering, a scheme which has a better step coverage property, such as CVD or spin coating, may be used to form the barrier layer 6.

According to the second embodiment, a conductive oxide which generally has a high electrical resistivity, such as SRO, is used for the lower conductive layer 5. In this case, it is desirable that a conductor whose electrical resistivity is lower than that of the lower conductive layer 5, e.g., aluminum, be used for the upper conductive layer 7. This can allow the plate potential VPL to be applied to the entire cell array having a wide area more effectively.

According to the second embodiment, the plate potential VPL is supplied to the upper conductive layer 7 and the barrier layer 6 is formed of a material having an insulating property, e.g., alumina. An equivalent circuit in this case is illustrated in FIG. 3A. The structure shown in FIG. 3A has a capacitor connected in series between the terminal for supplying the plate potential VPL and the cell capacitor, thereby reducing the effective cell capacitance.

In an ordinary DRAM, the plate electrode 4 is commonly used for multiple cells (typically, 256 kbits) and has a very large pattern. As a specific example, the area of the plate electrode 4 is approximately 48,000 $\mu m^2$ for the generation of, for example, the 0.15-$\mu$m rule. In this case, if alumina of 5 nm in thickness is used for the barrier layer 6, the capacitance becomes about $7 \times 10^5$ fF. The capacitance per one bit of cell capacitor is normally about 30 fF. Even if a capacitor of about $7 \times 10^5$ fF is connected in series, therefore, a reduction in the capacitance per one bit of cell capacitor is equal to or less than 0.01%, small enough to be negligible.

To increase the capacitance of the capacitor having the barrier layer 6 used as the dielectric layer, it is desirable to make the barrier layer 6 thinner than the capacitor film 3.

According to the second embodiment, aluminum is used for the upper conductive layer 7 and a TiN/Ti lamination film is used for the contact plug 53. Such a combination of aluminum and TiN easily achieves an excellent ohmic contact at the bottom of the contact plug 53.

The barrier layer 6 may be made conductive. An equivalent circuit in this case is illustrated in FIG. 3B. As one way of making the barrier layer 6 conductive is to reduce the amount of oxygen in, for example, alumina to a value lower than the stoichiometric ratio or $Al_2O_{3-d}$ (d >0). In the case where the barrier layer 6 is provided with a conductivity, if the barrier layer 6 merely has a high electrical resistivity or it merely has a slight conductivity, the resistance between the upper conductive layer 7 and the lower conductive layer 5 becomes sufficiently low. This is because the plate electrode 4 has a very large area as mentioned above. When the barrier layer 6 is provided with a conductivity, therefore, a reduction in cell capacitance can be suppressed.

A modification of the second embodiment will now be discussed.

Figure 8:
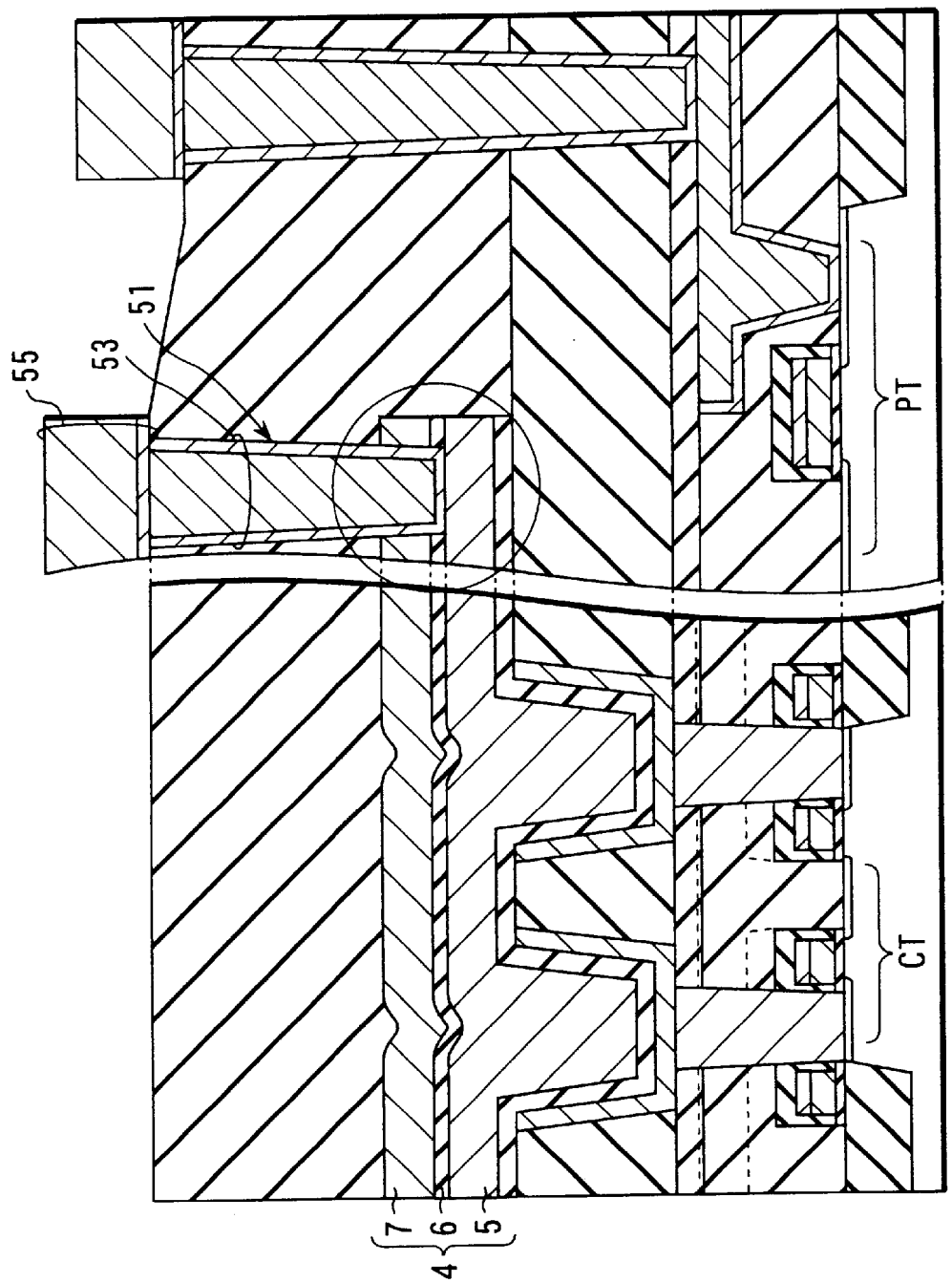
FIG. 8 is a cross-sectional view of a DRAM according to a modification of the second embodiment of this invention.

FIG. 8 is a cross-sectional view showing a DRAM according to a modification of the second embodiment of this invention.

As shown in FIG. 8, each contact hole 51 may be formed through both the upper conductive layer 7 so that the barrier layer 6 and the contact plug 53 directly contacts the lower conductive layer 5.

As the contact plug 53 directly contacts the lower conductive layer 5, this modification has an advantage of suppressing a reduction in cell capacitance as in the case where the barrier layer 6 is provided with a conductivity.

It should be noted that the contact hole 51 can be formed easily if the barrier layer 6 is thinner than the capacitor film 3.

Third Embodiment

Figure 9:
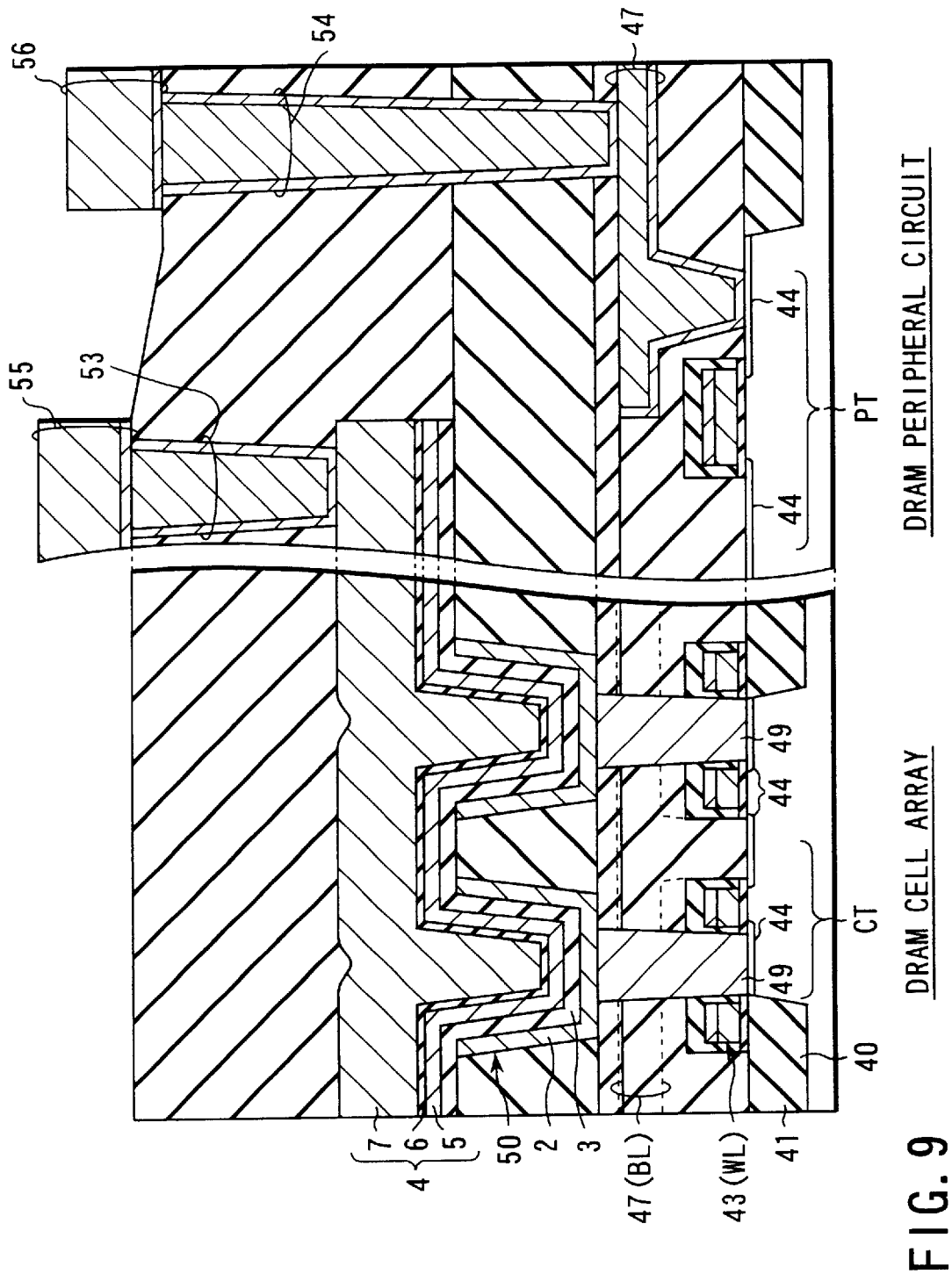
FIG. 9 is a cross-sectional view showing a DRAM according to a third embodiment of this invention.

FIG. 9 is a cross-sectional view showing the cross sections of a DRAM cell array according to the third embodiment and a peripheral circuit of the DRAM.

The DRAM according to the third embodiment illustrated in FIG. 9 together with its manufacturing method will be described below.

FIGS. 10A through 10H are cross-sectional views illustrating the DRAM according to the third embodiment of this invention step by step of main fabrication steps.

Figure 10A:
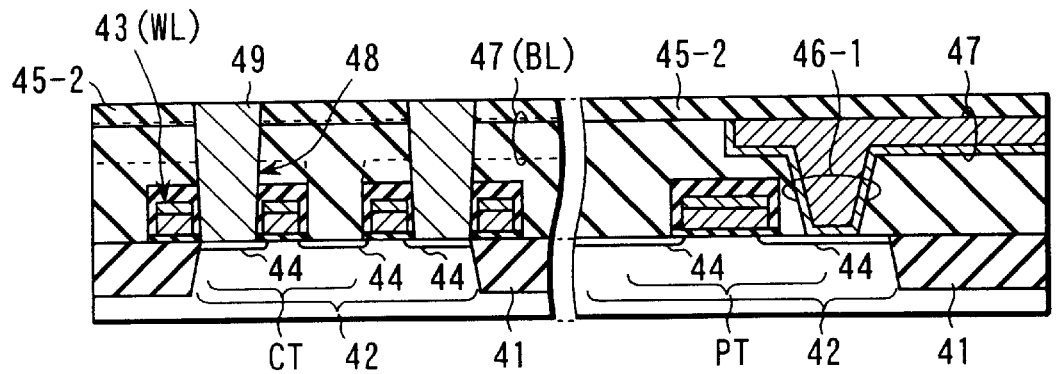
FIGS. 10A, 10B, 10C, 10D, 10E, 10F, 10G and 10H are cross-sectional views illustrating a DRAM according to the third embodiment of this invention step by step of main fabrication steps.

First, as shown in FIG. 10A, device isolation regions 41, cell transistors CT, peripheral transistors PT, bit line contacts (not shown) for connecting the drains of the cell transistors CT to the respective bit lines, bit lines 47 and contact plugs 49 for connecting the sources of the cell transistors CT to the respective storage electrodes are formed on a silicon substrate 40 by using the schme that has been explained earlier with reference to FIG. 7A.

Figure 10B:
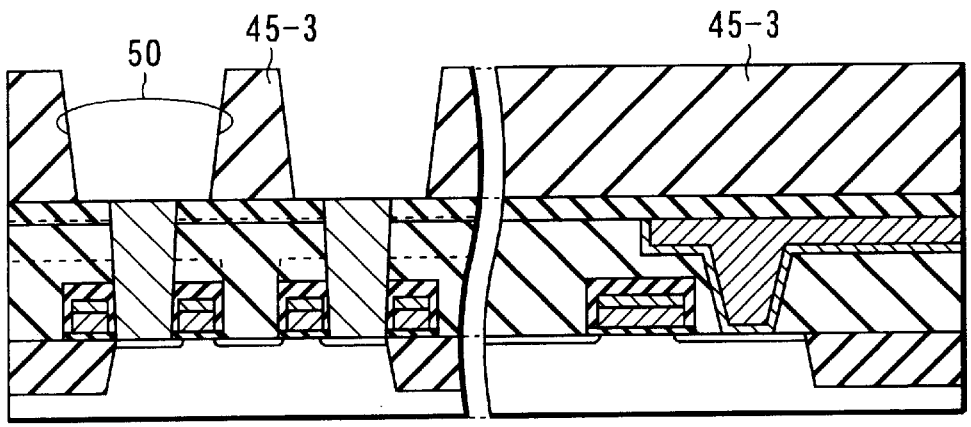

Then, as shown in FIG. 10B, a third interlayer insulating film 45-3 is formed on a second interlayer insulating film 45-2 where the contact plugs 49 are exposed. Then, openings 50 for forming cell capacitors are formed in the third interlayer insulating film 45-3 by using photolithography and RIE.

Figure 10C:
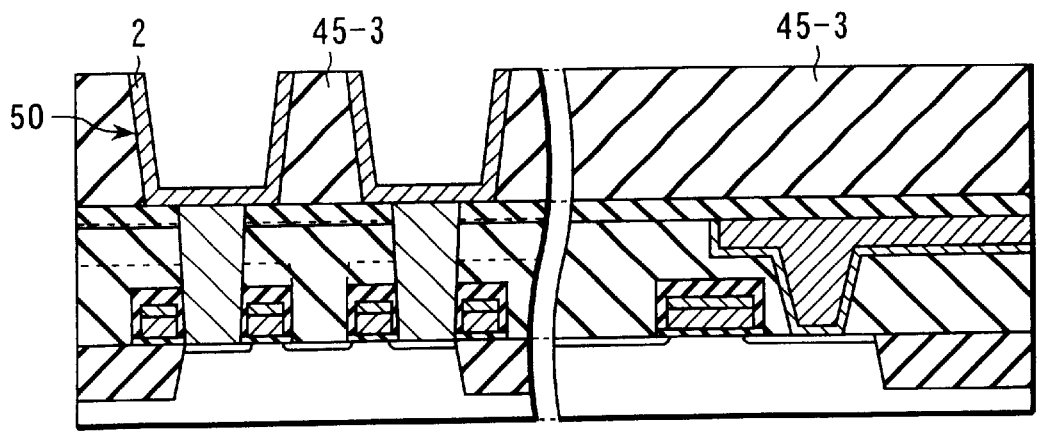

Next, as shown in FIG. 10C, a conductor such as SRO is deposited on the third interlayer insulating film 45-3 where the openings 50 are formed, thereby forming an SRO film. Then, those portions of the SRO film which exclude what is located in the openings 50 are removed by using CMP, for example. As a result, storage electrodes 2 of the SRO film are formed in the openings 50.

Figure 10D:
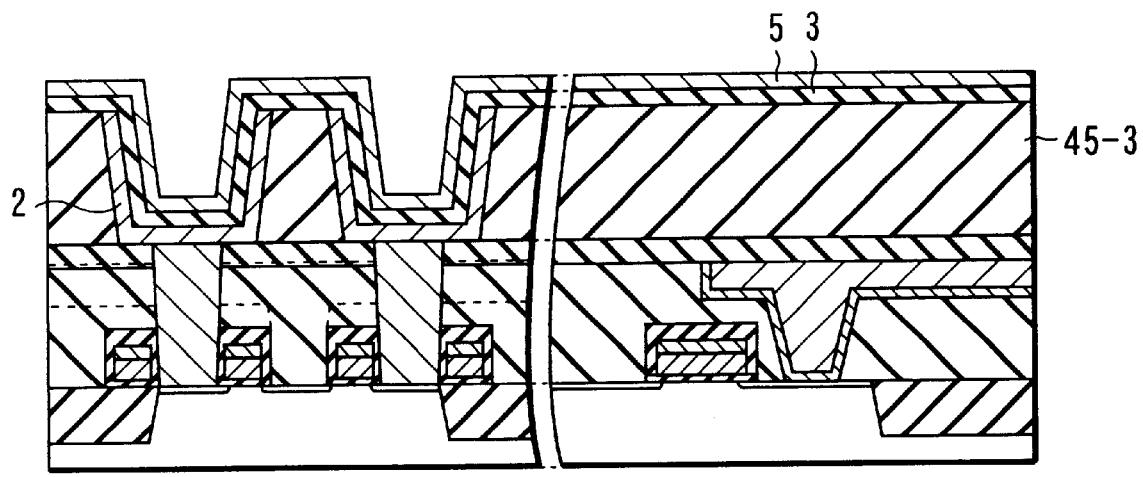

Next, a high-dielectric substance such as BSTO or a ferroelectric substance is deposited on the third interlayer insulating film 45-3 where the storage electrodes 2 are formed, thus forming the capacitor film 3 as shown in FIG. 10D. Then, a conductor such as SRO is deposited on the capacitor film 3, thereby forming the lower conductive layer 5.

Figure 10E:
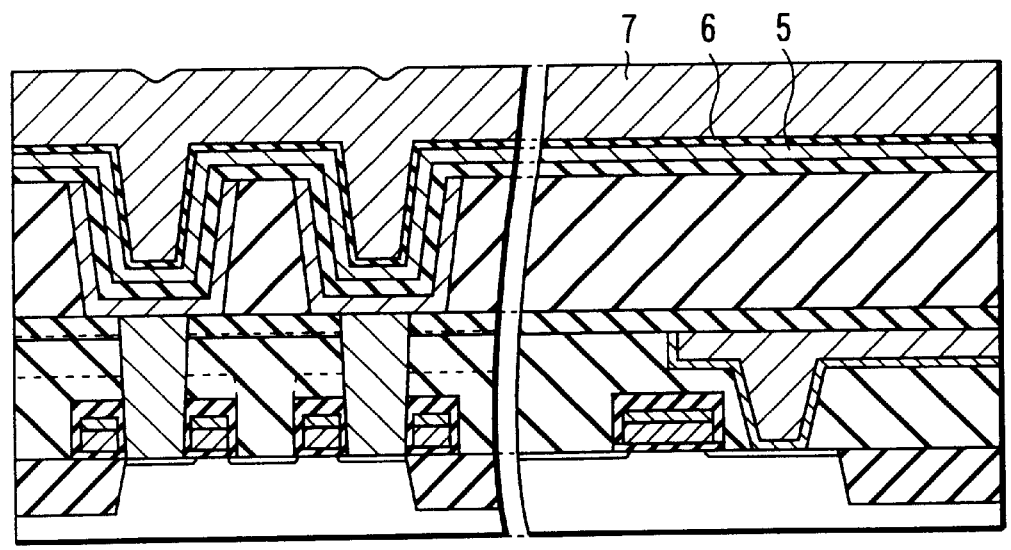

Next, a conductor, such as aluminum, is deposited on the lower conductive layer 5 by, for example, CVD, thereby forming the upper conductive layer 7 as shown in FIG. 10E. During this deposition, aluminum reacts with the SRO (lower conductive layer) 5 which is an oxide, thereby forming a barrier layer 6 of alumina ($Al_2O_3$) or the like at the interface between the lower conductive layer 5 and the upper conductive layer 7.

Figure 10F:
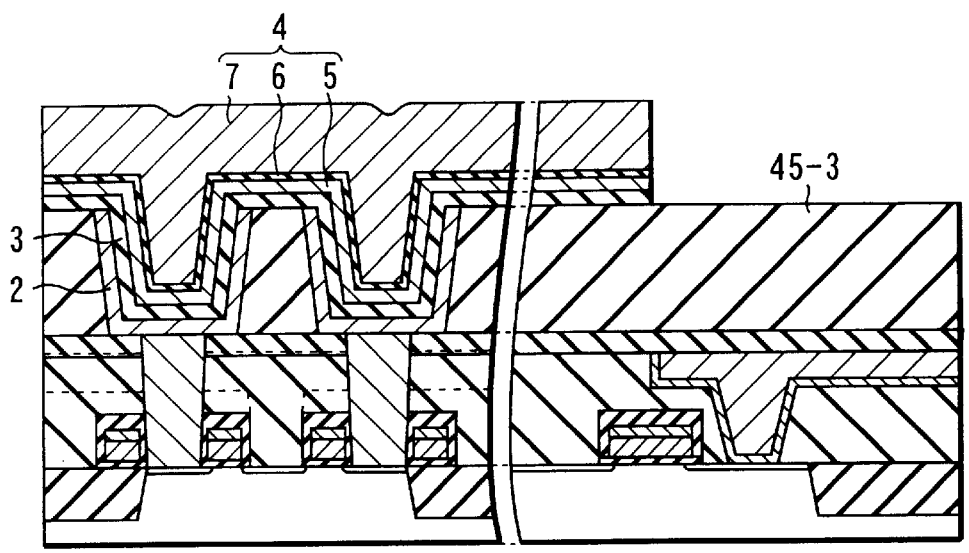

Next, the upper conductive layer 7, the barrier layer 6 and the lower conductive layer 5 are etched at a time by using photolithography and RIE, thus forming the plate electrode 4 as shown in FIG. 10F. Accordingly, the plate electrode 4 formed has a three-layer structure of the lower conductive layer 5, the barrier layer 6 and the upper conductive layer 7.

Figure 10G:
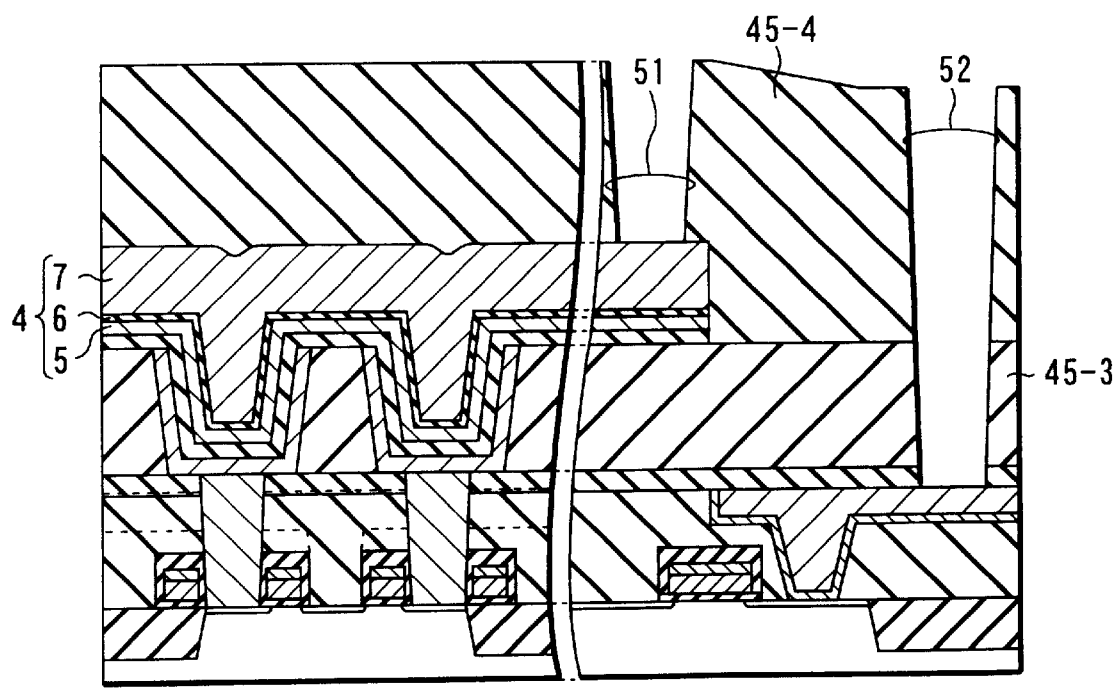

Then, a fourth interlayer insulating film 45-4 is formed on the third interlayer insulating film 45-3 on which the plate electrode 4 is formed, as shown in FIG. 10G. Next, contact holes 51 which are connected to the upper conductive layer 7 and contact holes 52 which are connected to the interconnection layer (BL) 47 are formed in the fourth interlayer insulating film 45-4 by using photolithography and RIE.

Figure 10H:
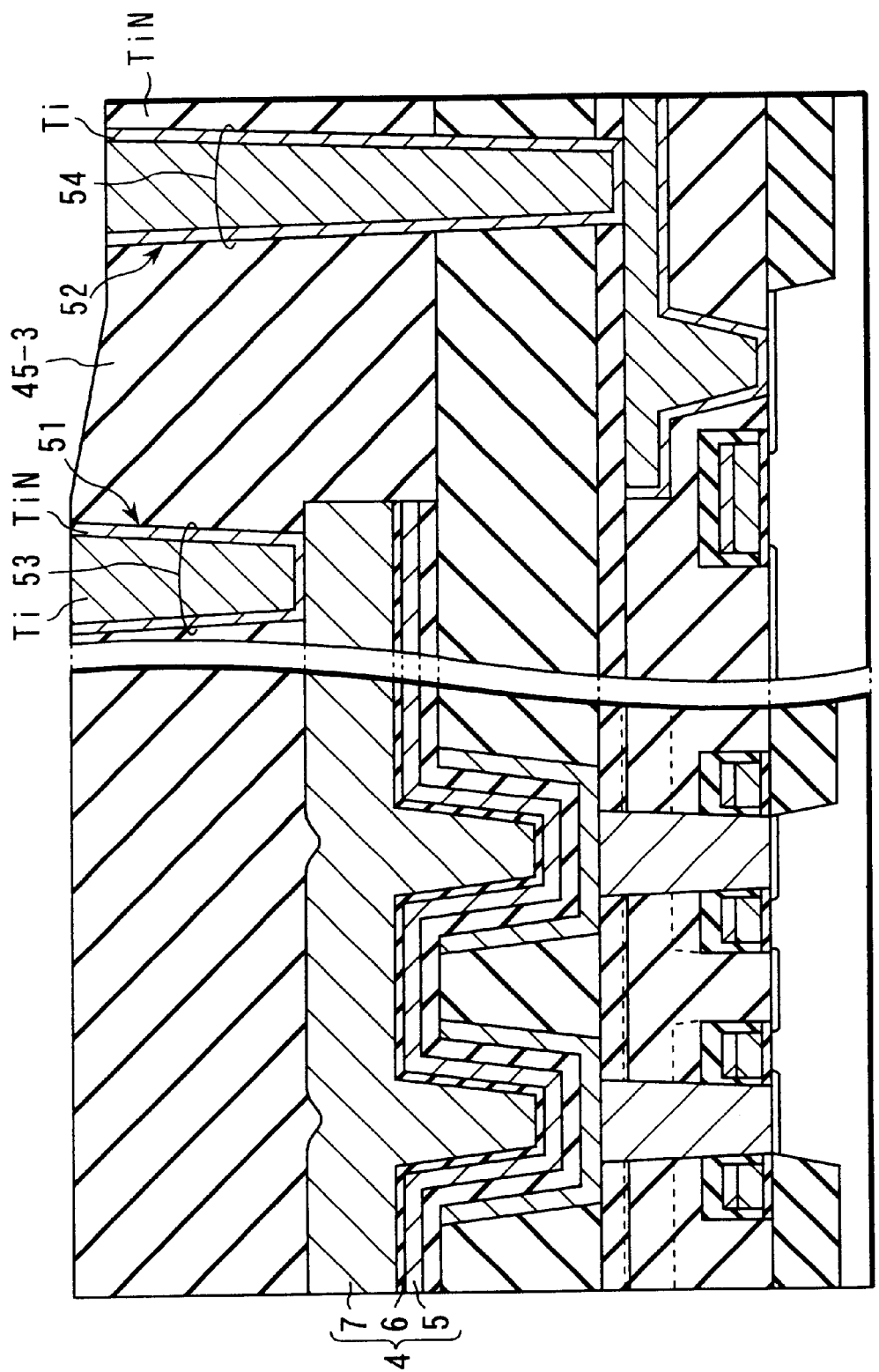

Next, as shown in FIG. 10H, titanium nitride (TiN) and titanium (Ti) are sequentially deposited on the fourth interlayer insulating film 45-4 where the contact holes 51 and 52 are formed, thus forming a TiN/Ti lamination film. Then, those portions of this lamination film which exclude the contact holes 51 and 52 are removed. As a result, contact plugs 53 and 54 of the TiN/Ti lamination film are respectively formed in the contact holes 51 and 52.

Then, as shown in FIG. 9, titanium nitride (TiN) and titanium (Ti) are sequentially deposited on the fourth interlayer insulating film 45-4 where the contact plugs 53 and 54 are formed, thus forming a TiN/Ti lamination film. Then, this lamination film is removed by using photolithography and RIE, thus forming interconnection layers 55 and 56.

Thereafter, though no particular illustration is given, further multiple interconnection layers are formed and a passivation film of silicon nitride or silicon dioxide is formed finally. Then, hydrogen annealing is performed to adjust the characteristics of the cell transistors CT and the characteristics of the peripheral transistors PT, which completes the DRAM according to the third embodiment.

The DRAM according to the third embodiment can have the same advantages as the DRAM according to the second embodiment.

According to the fabrication method for the third embodiment, the barrier layer 6 is formed by a reaction between the lower conductive layer 5 and the upper conductive layer 7. This can eliminate a film deposition step to form the barrier layer 6 and can thus contribute to suppressing a rise in the manufacturing cost.

As a modification of the third embodiment, a conductor such as aluminum is deposited on the lower conductive layer 5 of, for example, SRO or the like, thereby forming the upper conductive layer 7. Next, the upper conductive layer 7 and the lower conductive layer 5 are etched at a time by using photolithography and RIE, thus forming, first, the plate electrode 4 which has a double-layer structure of the lower conductive layer 5 and the upper conductive layer 7. Then, a heat treatment is carried out to cause a reaction at the interface of SRO and aluminum, thereby forming the barrier layer 6 of alumina ($Al_2O_3$) or the like, so that the plate electrode 4 finally has a three-layer structure of the lower conductive layer 5, the barrier layer 6 and the upper conductive layer 7.

This fabrication method can eliminate a film deposition step to form the barrier layer 6 and can thus contribute to suppressing a rise in the manufacturing cost. The fabrication method requires no etching of the barrier layer 6 at the time of carrying out an etching step of forming the pattern of the plate electrodes 4, thus facilitating the overall etching process.

Fourth Embodiment

Figure 11:
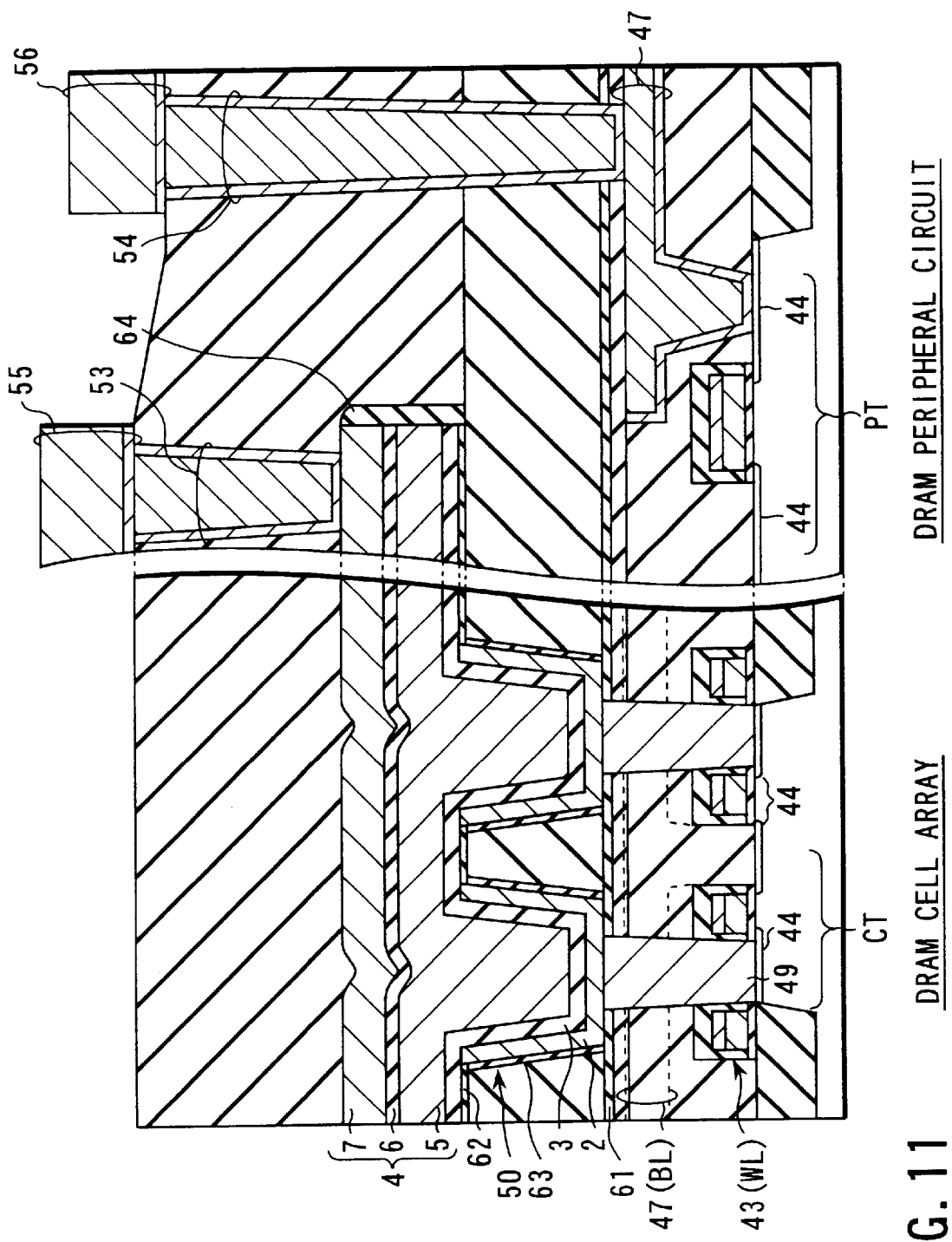
FIG. 11 is a cross-sectional view showing a DRAM according to a fourth embodiment of this invention.

FIG. 11 is a cross-sectional view showing the cross sections of a DRAM cell array according to the fourth embodiment and a peripheral circuit of the DRAM.

The DRAM according to the fourth embodiment illustrated in FIG. 11 together with its manufacturing method will be described below.

FIGS. 12A through 12L are cross-sectional views illustrating the DRAM according to the fourth embodiment of this invention step by step of main fabrication steps.

Figure 12A:
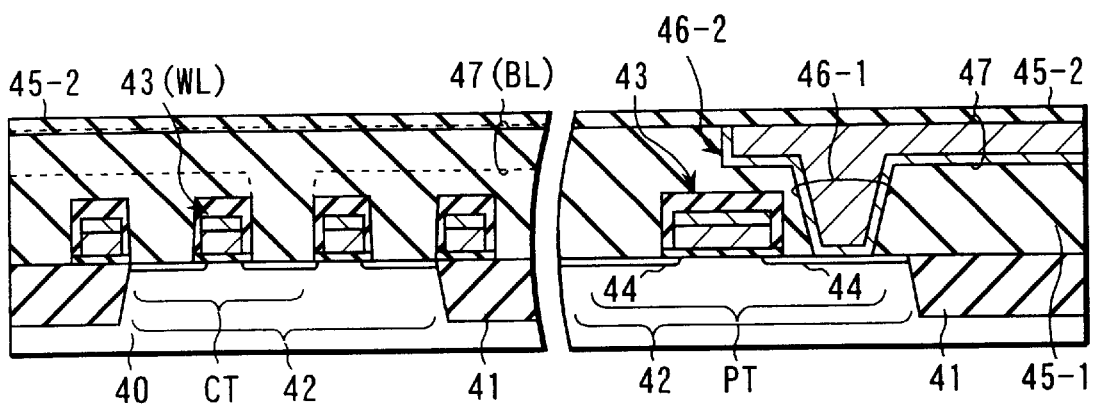
FIGS. 12A, 12B, 12C, 12D, 12E, 12F, 12G, 12H, 12I, 12J, 12K and 12L are cross-sectional views illustrating a DRAM according to the fourth embodiment of this invention step by step of main fabrication steps.

First, as shown in FIG. 12A, device isolation regions 41, cell transistors CT, peripheral transistors PT, bit line contacts (not shown) for connecting the drains of the cell transistors CT to the respective bit lines, and bit lines 47 are formed on a silicon substrate 40 by using the scheme that has been explained earlier with reference to FIG. 7A. Then, a second interlayer insulating film 45-2 is formed on a first interlayer insulating film 45-1 where the bit lines 47 are formed.

Figure 12B:
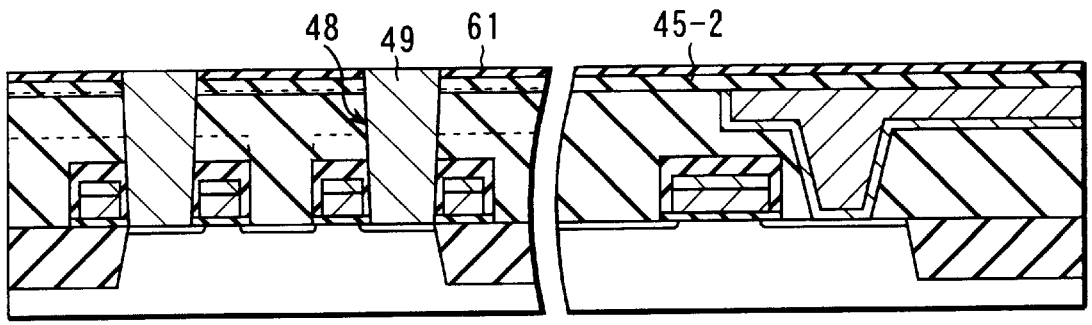

Next, as shown in FIG. 12B, alumina or the like is deposited on the second interlayer insulating film 45-2, thus forming a barrier film 61. Then, contact holes 48 which reach the sources of the associated cell transistors CT are formed in the barrier film 61, the second interlayer insulating film 45-2 and the first interlayer insulating film 45-1. Then, contact plugs 49 are formed in the contact holes 48.

Figure 12C:
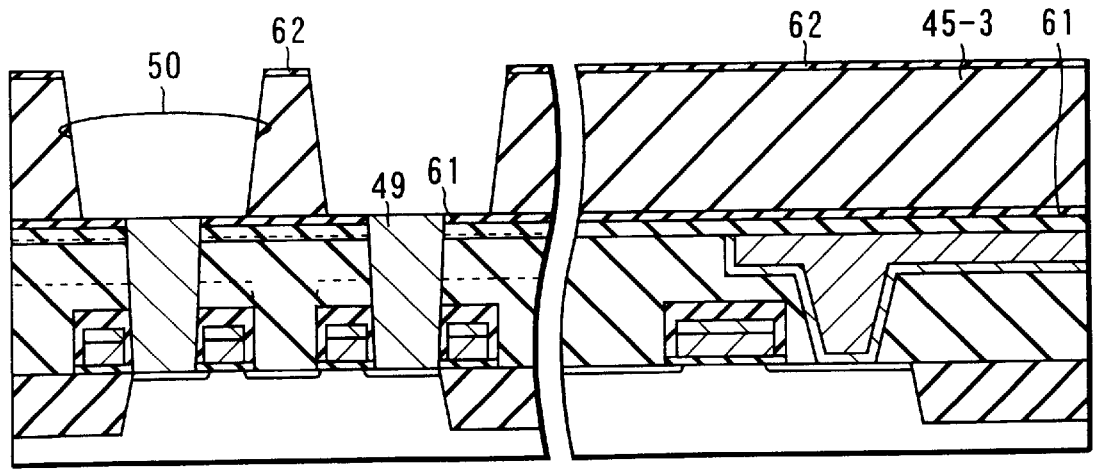

Then, as shown in FIG. 12C, a third interlayer insulating film 45-3 is formed on the second interlayer insulating film 45-2 where the contact plugs 49 are exposed. Then, alumina or the like is deposited on the third interlayer insulating film 45-3, thus forming a barrier film 62. Then, openings 50 for forming cell capacitors are formed in the barrier film 62 and the third interlayer insulating film 45-3 by using photolithography and RIE.

Figure 12D:
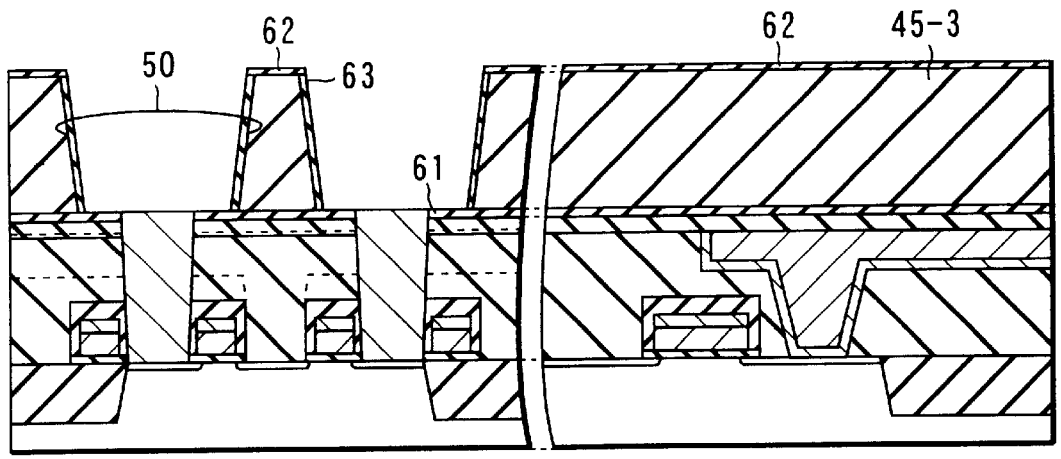

Next, as shown in FIG. 12D, alumina or the like is deposited on the third interlayer insulating film 45-3 where the openings 50 are formed, thus forming a barrier film 63. Then, the barrier film 63 is etched by RIE in such a way that the barrier film 63 remains on the side wall of each opening 50.

Figure 12E:
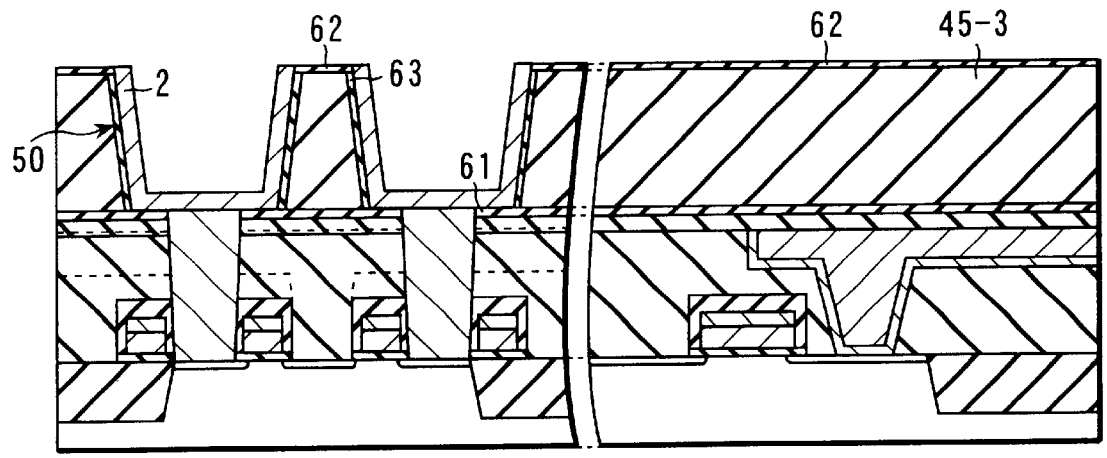

Then, as shown in FIG. 12E, a conductor such as SRO is deposited on the barrier films 63 and 62, thereby forming an SRO film. Then, those portions of the SRO film which exclude what is located in the openings 50 are removed by using CMP, for example. As a result, storage electrodes 2 of the SRO film are formed in the openings 50.

Figure 12F:
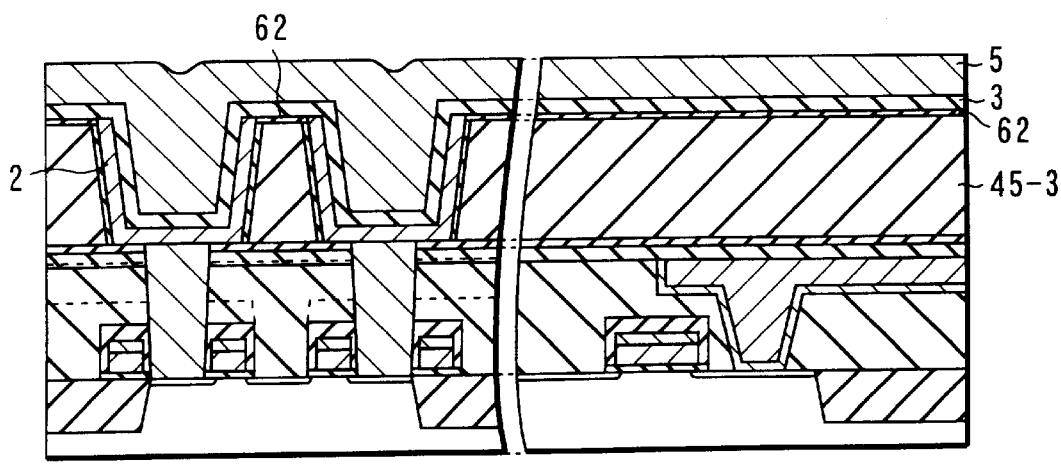
Figure 12G:
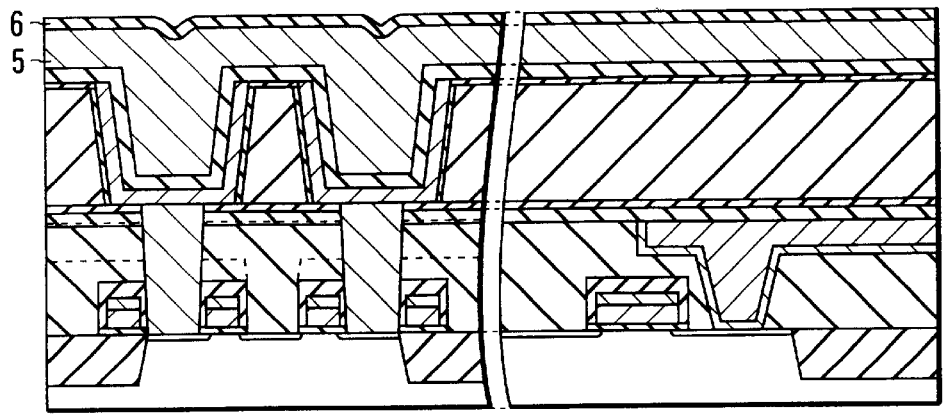

Next, a high-dielectric substance such as BSTO or a ferroelectric substance is deposited on the storage electrodes 2 and the barrier film 62, thus forming the capacitor film 3 as shown in FIG. 12F. Then, a conductor such as SRO is deposited on the capacitor film 3, thereby forming a lower conductive layer 5. Next, as shown in FIG. 12G, alumina is deposited thin on the lower conductive layer 5, thus forming a barrier layer 6. At this time, the thickness of alumina that constitutes the barrier layer 6 is about 5 nm and the film deposition is accomplished by sputtering in an atmosphere containing oxygen, for example.

Figure 12H:
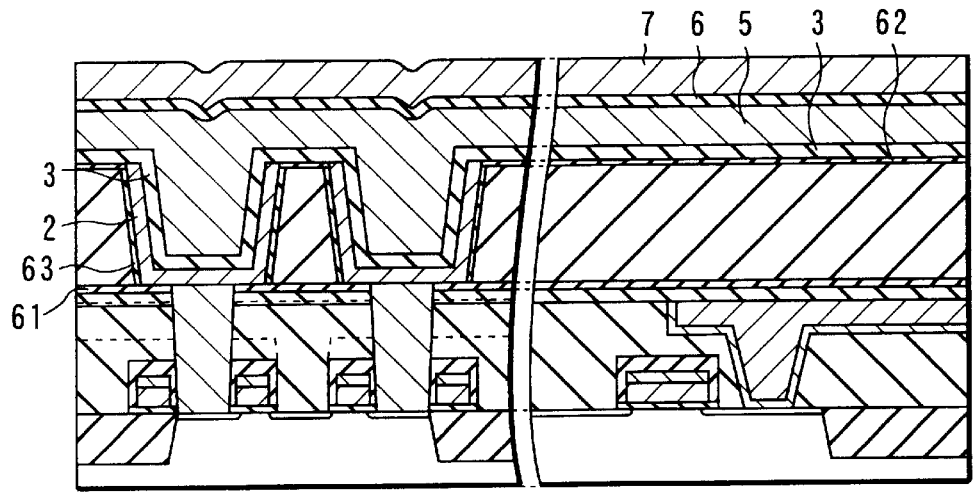

Then, a conductor such as aluminum is deposited on the barrier layer 6 by sputtering, thus forming an upper conductive layer 7 as shown in FIG. 12H.

Figure 12I:
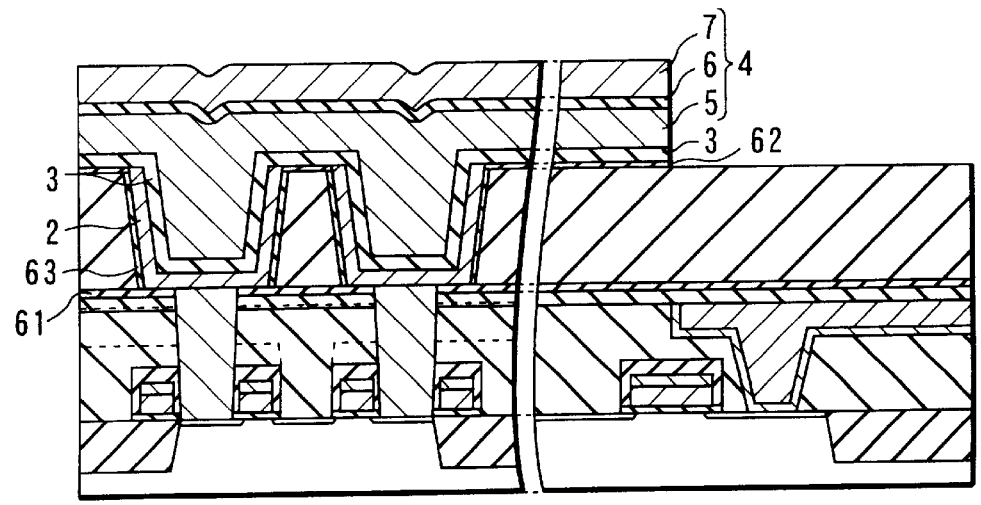

Next, the upper conductive layer 7, the barrier layer 6 and the lower conductive layer 5 are etched at a time by using photolithography and RIE, thus forming the plate electrode 4 as shown in FIG. 12I.

Figure 12J:
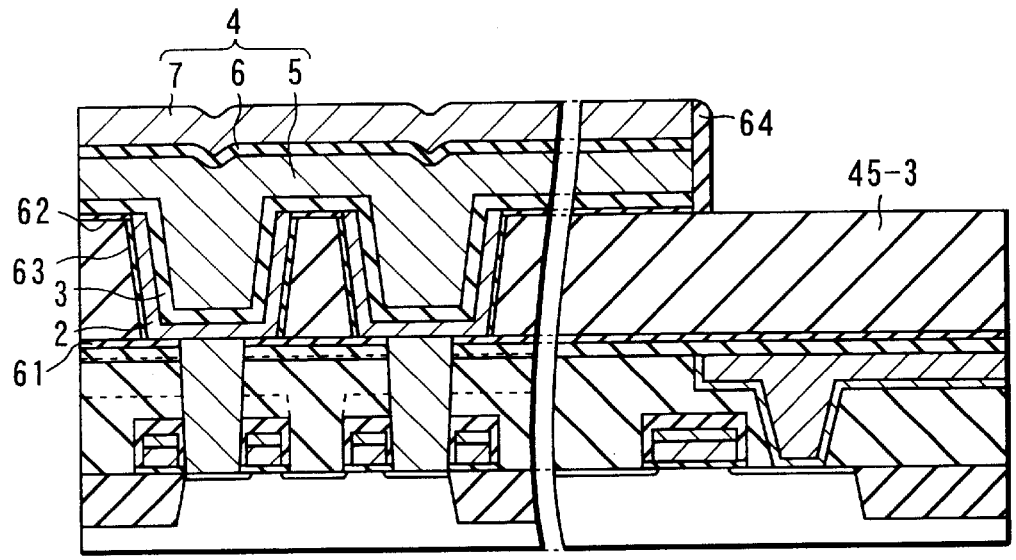
Figure 12K:
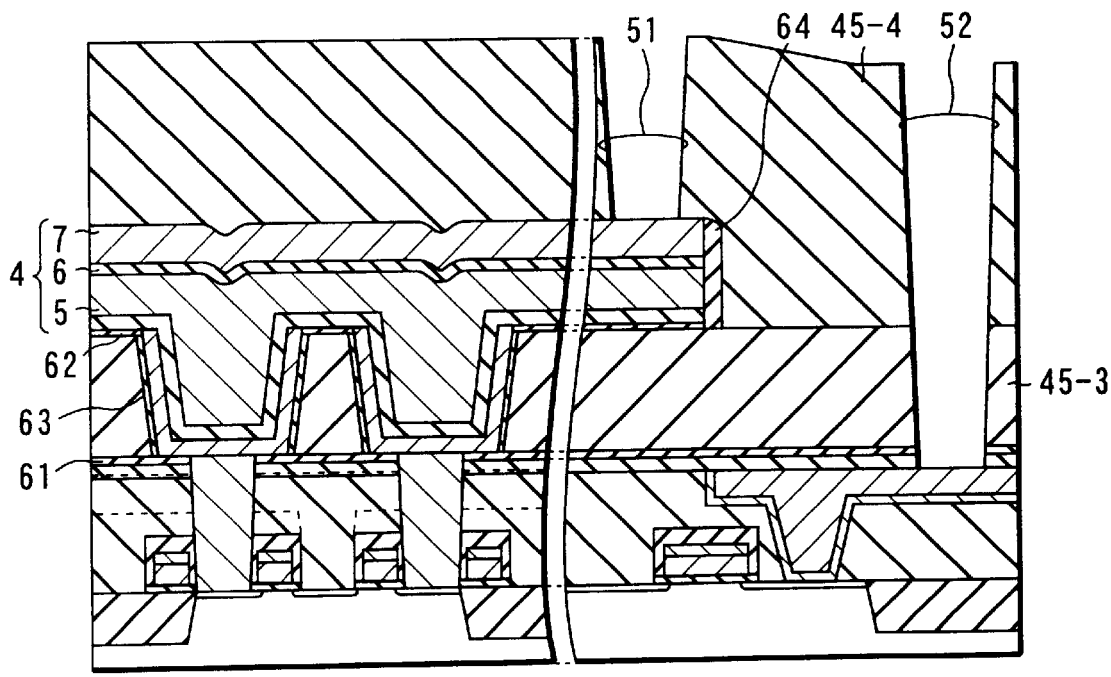

Then, alumina is deposited on the third interlayer insulating film 45-3 where the plate electrode 4 is formed, thereby forming a barrier film 64, as shown in FIG. 12J. Next, the barrier film 64 is etched by RIE so that the barrier film 64 remains on the side walls of the plate electrode 4. Accordingly, the capacitor structure which is comprised of the storage electrode 2, the capacitor film 3 and the plate electrode 4 is covered with the barrier films 61 to 64 and the barrier layer 6, excluding the upper portions of the plug 49.

Then, a fourth interlayer insulating film 45-4 is formed on the third interlayer insulating film 45-3 on which the plate electrode 4 and the barrier film 65 are formed, as shown in FIG. 10G. Next, contact holes 51 which are connected to the upper conductive layer 7 and contact holes 52 which are connected to the interconnection layer (BL) 47 are formed in the fourth interlayer insulating film 45-4 by using photolithography and RIE.

Figure 12L:
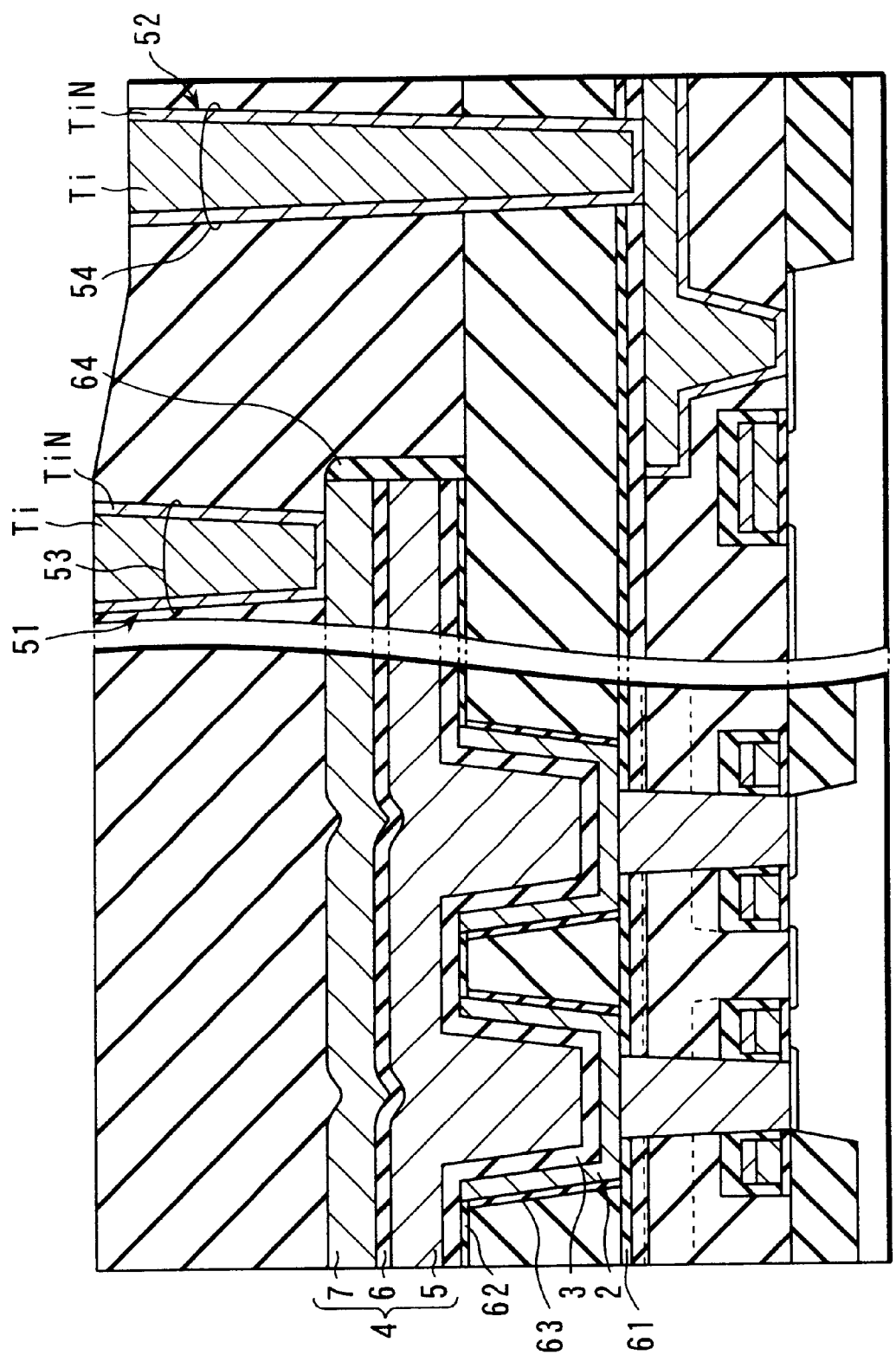

Next, as shown in FIG. 12L, titanium nitride (TiN) and titanium (Ti) are sequentially deposited on the fourth interlayer insulating film 45-4 where the contact holes 51 and 52 are formed, thus forming a TiN/Ti lamination film. Then, those portions of this lamination film which exclude the contact holes 51 and 52 are removed. As a result, contact plugs 53 and 54 of the TiN/Ti lamination film are respectively formed in the contact holes 51 and 52.

Then, as shown in FIG. 11, titanium nitride (TiN) and titanium (Ti) are sequentially deposited on the fourth interlayer insulating film 45-4 where the contact plugs 53 and 54 are formed, thus forming a TiN/Ti lamination film. Then, this lamination film is removed by using photolithography and RIE, thus forming interconnection layers 55 and 56.

Thereafter, though no particular illustration is given, further multiple interconnection layers are formed and a passivation film of silicon nitride or silicon dioxide is formed finally. Then, hydrogen annealing is performed to adjust the characteristics of the cell transistors CT and the characteristics of the peripheral transistors PT, which completes the DRAM according to the fourth embodiment.

According to the DRAM of the fourth embodiment, the capacitor structure is substantially covered with the barrier films 61 to 64 ($Al_2O_3$) and the barrier layer 6 ($Al_2O_3$). Even if hydrogen annealing is carried out after a multi-layer interconnection step, therefore, the barrier films 61 to 64 ($Al_2O_3$) protect the capacitor film 3 (BSTO) against a reduction originated damage. It is therefore possible to suppress the degradation of the film quality of the capacitor film 3 and prevent the degradation of the capacitor characteristics, such as an increase in leak current.

The above effect is further enhanced by combining the barrier films 61 to 64 ($Al_2O_3$) which cover at least a part of the capacitor structure with the plate electrode 4 which has a three-layer structure of the lower conductive layer 5 (SRO), the barrier layer 6 ($Al_2O_3$) and the upper conductive layer 7 (Al). This is because most of the portion around the capacitor film 3 is covered with the barrier layer 6 and the barrier films 61 to 64.

Although the first to fourth embodiments of this invention have been described above, this invention is not limited to those embodiments but may be modified in various other forms within the scope and spirit of the invention.

For instance, according to the second to fourth embodiments, the stacked capacitor is a "concave capacitor" wherein the storage electrode 2 is formed into a concave shape along the opening 50 and the concave surface is made to face the plate electrode 4, as shown in FIG. 13A.

The stacked capacitor may however be modified to be a "convex capacitor" wherein the storage electrode 2 is formed into a convex shape and the convex surface is made to face the plate electrode 4, as shown in FIG. 13B. Alternatively, the stacked capacitor may be modified to be a "cylindrical capacitor" as shown in FIG. 13C. The cylindrical capacitor film is formed by forming the storage electrode 2 into a concave shape along the opening 50 and then removing a part or all of the fourth interlayer insulating film 45-4 from that surface.

This invention is not limited to a stacked capacitor but may be adapted to a "planar capacitor" as well. One example of a "planar capacitor" to which this invention is adapted is illustrated in FIG. 13D. In the illustrated "planar capacitor", the storage electrode is formed from a Ti layer 71, a TiN layer 72 and an SRO layer 73 which are formed in the silicon substrate 40. Then, the capacitor film (BSTO) is formed on the SRO layer 73 and the plate electrode 4 comprised of the lower conductive layer 5 (SRO), the barrier layer 6 ($Al_2O_3$) and the upper conductive layer 7 (Al) is formed on this capacitor film 3.

The capacitor structure according to this invention can be adapted to memory cells having a stacked gate structure which are used in an EEPROM or the like as shown in FIG. 13E, as well as 1-transistor-1-capacitor type DRAM or FRAM.

As shown in FIG. 13E, each memory cell having a stacked gate structure comprises a gate insulating film 81 formed on the silicon substrate 40, a floating gate 82 formed on the gate insulating film 81 and a control gate 84 which is capacitively coupled to the floating gate 82 via a capacitor film 83.

When memory cells having a stacked gate structure are used in, for example, an EEPROM, there is a demand of making the capacitance between the floating gate 82 and the control gate 84 greater than the capacitance between the floating gate 82 and the silicon substrate 40 in order to improve the efficiency of injecting charges into the floating gate 82. Therefore, a high-dielectric substance or ferroelectric substance which has a higher dielectric constant than a silicon oxide film or a silicon nitride film is likely to be used as the material for the capacitor film 83. Examples of such a high-dielectric substance and ferroelectric substance are $(Ba,Sr)TiO_3$ (generally, BSTO), $BaTiO_3$, $SrTiO_3$, $Ta_2O_5$, $Pb(Zr,Ti)O_3$ (generally, PZT), $Pb(Nb,Ti)O_3$, $PbZrO_3$, $LiNbO_3$, $SrBi_2Ta_2O_9$, $SrBi_2(Ta,Nb)_2O_9$ and $Bi_4Ti_3O_{13}$, which have already been discussed in the foregoing description of the first embodiment.

When such a high-dielectric substance or ferroelectric substance is used for the capacitor film 83, the degradation of the film quality should be suppressed as much as possible because it leads to an increase in leak current, thus resulting in the deterioration of the charge retaining characteristic.

In this respect, the gate insulating film 81 is formed of a metal oxide which contains at least one of metals Al, W, Cu, Ti, Co, Ta, Nb, Ru and Ir.

According to the memory cells having a stacked gate structure, when hydrogen annealing is performed, the gate insulating film 81 protects the capacitor film 83 against a reduction-originated damage. It is therefore possible to suppress the degradation of the film quality of the capacitor film 83 and prevent the degradation of the charge retaining characteristics, such as an increase in leak current.

When the barrier layer 6 has an insulating property, the following advantage can further be provided.

Figure 14A:
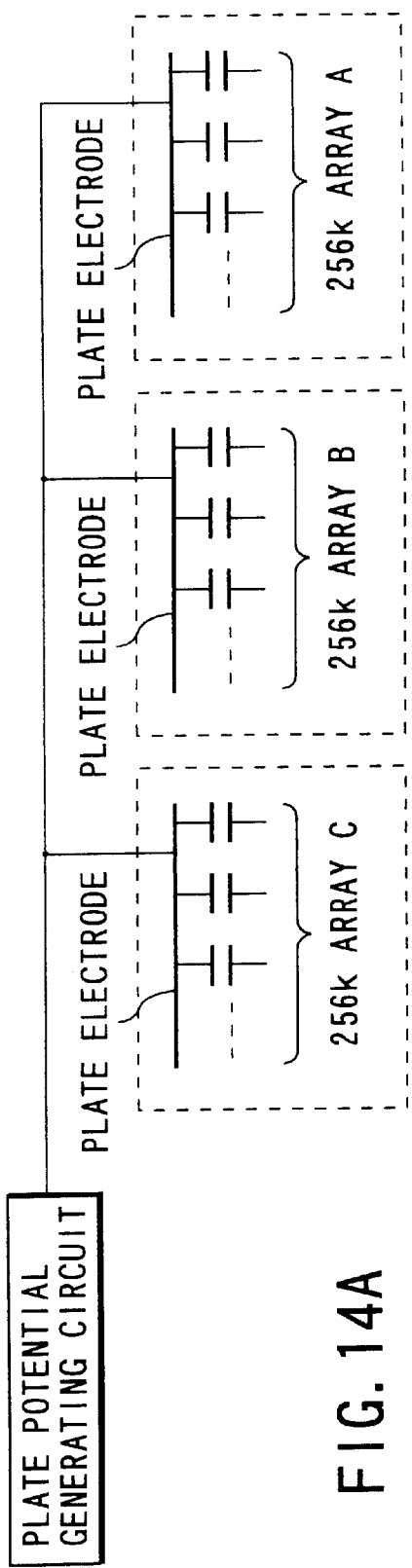
FIGS. 14A and 14B are circuit diagrams each showing connection between a plate potential generating circuit and a plate electrode.
Figure 14B:
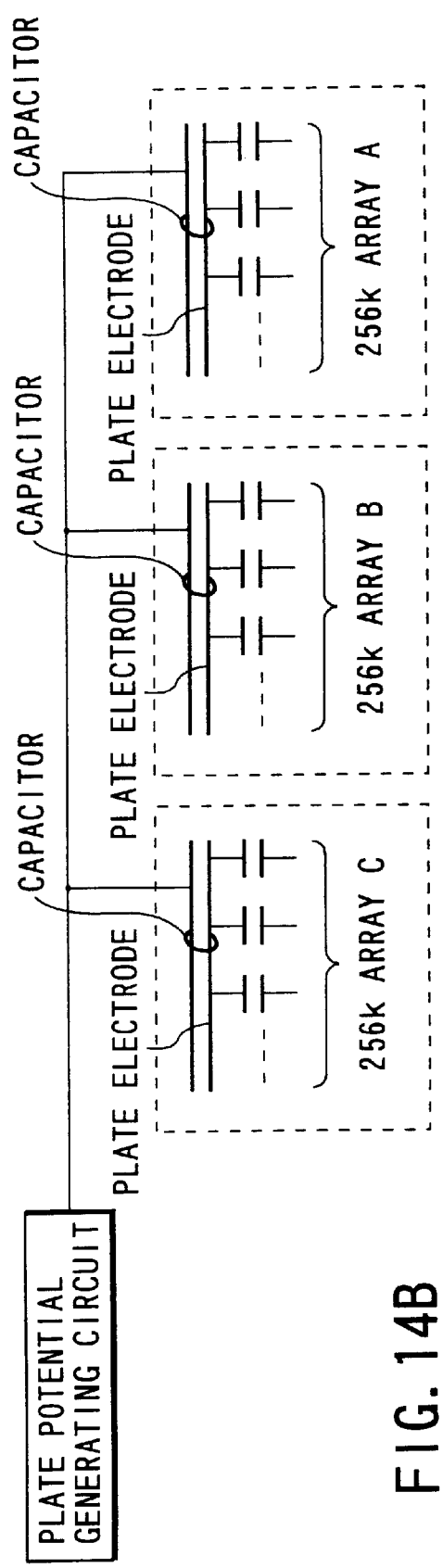

In the case of a DRAM of 265 Mbits, the cell array is grouped into sub arrays of 256 kbits as shown in FIG. 14A. That is, the plate electrode is segmented for every 256 kbits.

Under the situation shown in FIG. 14A, when one cell array, for example, a cell array A, is accessed (for reading/writing), the potential of the plate electrode in the cell array A slightly fluctuates. This slight fluctuation becomes noise which is transmitted to the line that supplies the plate potential to the plate electrode. The nose transmitted to the line is transmitted to another plate electrode which is directly connected via a line to the plate electrode in the cell array A, i.e., the plate electrode in the cell array B, the plate electrode in the cell array C and so forth. As a result, the potentials of the plate electrodes in the unaccessed or inactive cell arrays B, C and so forth fluctuate. The fluctuation of the potentials of the plate electrodes may adversely affect the data retaining characteristics of cells.

When the capacitor structure has the barrier layer 6 which has an insulating property, by way of contrast, the a capacitor is inserted in series between the line for supplying the plate potential and the plate electrode. The series-inserted capacitor absorbs a fluctuation of the potential of the plate electrode in an accessed cell array, e.g., the cell array A. This makes the fluctuation of the potential of the plate electrode in the cell array A hard to be transmitted to the line that supplies the plate potential, thus suppressing the fluctuation of the potentials of the plate electrodes in the unaccessed cell arrays B, C and so forth. It is thus possible to suppress the deterioration of the data retaining characteristic of cells in unaccessed cell arrays.

Further, this structure has a resistance to other noise other than the one a memory cell generates at the time it is accessed. Even when noise is applied to the line that supplies the plate potential, for example, this noise is absorbed by the series-inserted capacitor. This likewise suppresses the fluctuation of the potential of the plate electrode and thus restrains the deterioration of the data retaining characteristic of cells.

When the plate electrode is segmented for individual cell arrays, as apparent from the above, inserting the capacitor in series between the line that supplies the plate potential and the plate electrode can suppress the degradation in the data retaining characteristic which is originated from noise generated by a memory cell at the time it is accessed or noise applied to the line that supplies the plate potential.

When there is one plate electrode, a capacitor should be inserted in series between the plate potential generating circuit 11 and the plate electrode. In this case, when noise is applied to the line that supplies the plate potential, particularly, the degradation in the data retaining characteristic which is originated from this noise can be suppressed.

As apparent from the above, this invention can provide a semiconductor device whose structure can restrain the deterioration of a dielectric film which constitutes a capacitor film even when annealing is performed in an atmosphere containing a reducing agent, and a semiconductor device having this capacitor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   one electrode formed above a semiconductor substrate; and
   a plate electrode facing said one electrode via a dielectric film, said plate electrode including a lower conductive layer formed on said dielectric film, a barrier layer formed on said lower conductive layer and an upper conductive layer formed on said barrier layer,
   wherein said one electrode, said dielectric film and said lower conductive layer constitute a first capacitor, said lower conductive layer, said barrier layer and said upper conductive layer constitute a second capacitor, and a capacitance of said second capacitor is greater than that of said first capacitor.

2. The semiconductor device according to claim 1, wherein an electrical resistivity of said upper conductive layer is lower than those of said lower conductive layer and said barrier layer.

3. The semiconductor device according to claim 1, wherein said barrier layer is formed of a metal oxide containing at least one of Ta, Al, W, Cu, Ti, Co, Nb, Ru, and Ir.

4. The semiconductor device according to claim 1, wherein said barrier layer is formed of a silicon nitride.

5. The semiconductor device according to claim 1, wherein said dielectric film is formed of an oxide.

6. The semiconductor device according to claim 5, wherein said oxide contains at least one of $(Ba,Sr)TiO_3$, $BaTiO_3$, $SrTiO_3$, $Ta_2O_5$, $Pb(Zr,Ti)O_3$, $Pb(Nb,Ti)O_3$, $PbZrO_3$, $LiNbO_3$, $SrBi_2Ta_2O_9$, $SrBi_2(Ta,Nb)_2O_9$ and $Bi_4Ti_3O_{13}$.

7. The semiconductor device according to claim 1, wherein said lower conductive layer contains at least one of Pt, Ru, Re, Os, Rh, Ir, Fe, Mn, Cr, Co, Ni and Ti.

8. The semiconductor device according to claim 1, wherein said upper conductive layer contains at least one of Al, W, Cu, Ti, Co, Ta and Nb.

9. The semiconductor device according to claim 1, further comprising:
   a circuit which generates a potential to be applied to said plate electrode.

10. The semiconductor device according to claim 9, wherein said circuit is a plate-potential generating circuit.

11. The semiconductor device according to claim 10, wherein said semiconductor device is a DRAM.

12. A semiconductor device according to claim 9, wherein said circuit is a driving pulse line driver.

13. The semiconductor device according to claim 12, wherein said semiconductor device is a FRAM.

14. The semiconductor device comprising:
    a plurality of dispersion electrodes formed in a dispersed manner above a semiconductor substrate; and
    a plate electrode facing said dispersion electrodes via respective dielectric films, said plate electrode including a lower conductive layer formed on said dielectric films, a barrier layer formed on said lower conductive layer and an upper conductive layer formed on said barrier layer,
    wherein each of said dispersion electrodes, each of said dielectric films and said lower conductive layer constitute a first capacitor, said lower conductive layer, said barrier layer and said upper conductive layer constitute a second capacitor, and a capacitance of said second capacitor is greater than that of said first capacitor.

15. The semiconductor device according to claim 14, wherein said barrier layer is formed of a metal oxide containing at least one of Ta, Al, W, Cu, Ti, Co. Nb, Ru, and Ir.

16. The semiconductor device according to claim 14, wherein said barrier layer is formed of a silicon nitride.

17. The semiconductor device according to claim 14, wherein said dielertric films are formed of an oxide.

18. The semiconductor device according to claim 17, wherein said oxide contains at least one of $(Ba,Sr)TiO_3$, $BaTiO_3$, $SrTiO_3$, $Ta_2O_5$, $Pb(Zr,Ti)O_3$, $Pb(Nb,Ti)O_3$, $PbzrO_3$, $LiNbO_3$, $SrBi_2Ta_2O_9$, $SrBi_2(Ta,Nb)_2O_9$ and $Bi_4Ti_3O_{13}$.

19. The semiconductor device according to claim 14, wherein said lower conductive layer contains at least one of Pt, Ru, Re, Os, Rh, Ir, Fe, Mn, Cr, Co, Ni and Ti.

20. The semiconductor device according to claim 14, wherein said upper conductive layer contains at least one of Al, W, Cu, Ti, Co, Ta and Nb.

21. The semiconductor device according to claim 14, further comprising:
    a circuit which generates a potential to be applied to said plate electrode.

22. A semiconductor device according to claim 21, wherein said circuit is a plate-potential generating circuit.

23. The semiconductor device according to claim 22, wherein said semiconductor device is a DRAM.

24. The semiconductor device according to claim 21, wherein said circuit is a driving pulse line driver.

25. The semiconductor device according to claim 24, wherein said semiconductor device is a FRAM.

26. A semiconductor device comprising:
comprising:
a plurality of dispersion electrodes formed in a dispersed manner above a semiconductor substrate; and
a plate electrode facing said dispersion electrodes via respective dielectric films, said plate electrode including a lower conductive layer formed on said dielectric films, a barrier layer formed on said lower conductive layer and an upper conductive layer formed on said barrier layer, and said barrier layer being formed of a metal oxide containing at least one of Ta, Al, W, Cu, Ti, Co, Nb, Ru, and Ir.

27. A semiconductor device according to claim 26, wherein said dielectric films are formed of an oxide.

28. The semiconductor device according to claim 27, wherein said oxide contains at least one of $(Ba,Sr)TiO_3$, $BaTiO_3$, $SrTiO_3$, $Ta_2O_5$, $Pb(Zr,Ti)O_3 Pb(Nb,Ti)O_3$, $PbZrO_3$, $LiNbO_3$, $SrBi_2Ta_2O_9$, $SrBi_2(Ta,Nb)_2O_9$ and $Bi_4Ti_3O_{13}$.

29. The semiconductor device according to claim 26, wherein said lower condictive layer contains at least one of Pt, Ru, Re, Os, Rh, Ir, Fe, Mn, Cr, Co, Ni and Ti.

30. The semiconductor device according to claim 26, wherein said upper conductive layer contains at least one of Al, W, Cu, Ti, Co, Ta and Nb.

31. A semiconductor device comprising:
memory cells each having a cell capacitor which includes a storage electrode and a plate electrode facing said storage electrode via a dielectric film;
a circuit which generates a potential to be applied to said plate electrode; and
a capacitor connected in series between an output terminal of said circuit and said plate electrode.

32. The semiconductor device according to claim 31, wherein said circuit is a plate-potential generating circuit.

33. The semiconductor device according to claim 32, wherein said semiconductor device is a DRAM.

34. The semiconductor device of claim 31, wherein said circuit is a driving pulse line driver.

35. The semiconductor device according to claim 34, wherein said semiconductor device is a FRAM.

* * * * *